United States Patent
Riepe et al.

(10) Patent No.: US 7,103,863 B2
(45) Date of Patent: Sep. 5, 2006

(54) REPRESENTING THE DESIGN OF A SUB-MODULE IN A HIERARCHICAL INTEGRATED CIRCUIT DESIGN AND ANALYSIS SYSTEM

(75) Inventors: Michael A. Riepe, San Jose, CA (US); Robert M. Swanson, Palo Alto, CA (US); Timothy M. Burks, Palo Alto, CA (US); Lukas van Ginneken, San Jose, CA (US); Karen F. Vahtra, Sunnyvale, CA (US); Hamid Savoj, Los Altos, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 0 days.

(21) Appl. No.: 10/167,293

(22) Filed: Jun. 10, 2002

(65) Prior Publication Data

US 2004/0078767 A1    Apr. 22, 2004

Related U.S. Application Data

(60) Provisional application No. 60/296,797, filed on Jun. 8, 2001, provisional application No. 60/296,792, filed on Jun. 8, 2001.

(51) Int. Cl.
*G06F 17/50* (2006.01)
(52) U.S. Cl. ............... 716/7; 716/6; 716/8; 716/12; 716/2
(58) Field of Classification Search ............. 716/7, 716/6, 8, 12, 2
See application file for complete search history.

(56) References Cited

U.S. PATENT DOCUMENTS

| | | | |
|---|---|---|---|
| 3,599,008 A * | 8/1971 | Gorski-Popiel | 307/80 |
| 5,278,105 A * | 1/1994 | Eden et al. | 438/129 |
| 5,349,542 A * | 9/1994 | Brasen et al. | 703/15 |
| 5,629,860 A * | 5/1997 | Jones et al. | 716/6 |
| 5,644,498 A | 7/1997 | Joly et al. | |
| 5,822,214 A * | 10/1998 | Rostoker et al. | 716/10 |
| 5,835,380 A * | 11/1998 | Roethig | 716/2 |
| 5,878,053 A | 3/1999 | Koh et al. | 714/724 |
| 5,920,484 A | 7/1999 | Nguyen et al. | 703/2 |
| 6,072,945 A * | 6/2000 | Aji et al. | 716/5 |
| 6,145,117 A * | 11/2000 | Eng | 716/18 |
| 6,202,191 B1 * | 3/2001 | Filippi et al. | 716/5 |
| 6,209,123 B1 * | 3/2001 | Maziasz et al. | 716/14 |
| 6,216,252 B1 | 4/2001 | Dangelo et al. | 716/1 |
| 6,253,359 B1 * | 6/2001 | Cano et al. | 716/6 |
| 6,292,927 B1 * | 9/2001 | Gopisetty et al. | 716/11 |
| 6,345,378 B1 | 2/2002 | Joly et al. | |
| 6,360,350 B1 * | 3/2002 | Gabele et al. | 716/1 |

(Continued)

FOREIGN PATENT DOCUMENTS

EP    0 809 736 A    11/1997

(Continued)

OTHER PUBLICATIONS

PCT US02/18424, Oct. 10, 2003, PCT Search Report.

(Continued)

*Primary Examiner*—Phallaka Kik
(74) *Attorney, Agent, or Firm*—Pillsbury Winthrop Shaw Pittman LLP

(57) ABSTRACT

A method for modeling integrated circuit designs in a hierarchical design automation system which utilizes a block abstraction including therein set of all database objects (cells, nets, wires, vias, and blockages) that are necessary to achieve accurate placement, routing, extraction, simulation, and verification of the block's ancestors in the hierarchy.

68 Claims, 13 Drawing Sheets

U.S. PATENT DOCUMENTS

| | | | |
|---|---|---|---|
| 6,418,551 B1* | 7/2002 | McKay et al. | 716/5 |
| 6,430,729 B1* | 8/2002 | Dewey et al. | 716/4 |
| 6,438,729 B1* | 8/2002 | Ho | 716/1 |
| 6,457,160 B1* | 9/2002 | Graef et al. | 716/6 |
| 6,473,891 B1* | 10/2002 | Shively | 716/12 |
| 6,499,131 B1* | 12/2002 | Savithri et al. | 716/5 |
| 6,526,549 B1* | 2/2003 | You | 716/5 |
| 6,530,066 B1* | 3/2003 | Ito et al. | 716/5 |
| 6,532,574 B1* | 3/2003 | Durham et al. | 716/6 |
| 6,536,028 B1* | 3/2003 | Katsioulas et al. | 716/17 |
| 6,615,395 B1* | 9/2003 | Hathaway et al. | 716/6 |
| 6,622,291 B1* | 9/2003 | Ginetti | 716/9 |
| 6,625,611 B1* | 9/2003 | Teig et al. | 707/102 |
| 6,671,866 B1* | 12/2003 | Arsintescu | 716/10 |
| 6,704,697 B1* | 3/2004 | Berevoescu et al. | 703/19 |
| 6,732,340 B1* | 5/2004 | Akashi | 716/5 |
| 6,799,153 B1* | 9/2004 | Sirichotiyakul et al. | 703/19 |
| 6,865,721 B1* | 3/2005 | Dahl et al. | 716/2 |
| 6,876,961 B1* | 4/2005 | Marshall et al. | 703/19 |
| 7,016,820 B1* | 3/2006 | Kimura et al. | 703/2 |
| 2001/0010090 A1* | 7/2001 | Boyle et al. | 716/2 |
| 2001/0018757 A1* | 8/2001 | Morikawa | 716/5 |
| 2002/0059553 A1* | 5/2002 | Eng | 716/4 |
| 2002/0087940 A1* | 7/2002 | Greidinger et al. | 716/2 |
| 2002/0112212 A1* | 8/2002 | Cohn et al. | 716/1 |
| 2002/0112220 A1* | 8/2002 | Miller | 716/10 |
| 2002/0133791 A1* | 9/2002 | Cohn et al. | 716/4 |
| 2002/0174409 A1* | 11/2002 | Cohn et al. | 716/6 |
| 2002/0194575 A1* | 12/2002 | Allen et al. | 716/17 |
| 2004/0128636 A1* | 7/2004 | Ishikura | 716/7 |
| 2004/0225991 A1* | 11/2004 | Fitzhenry et al. | 716/13 |
| 2006/0053396 A1* | 3/2006 | Eng | 716/7 |

FOREIGN PATENT DOCUMENTS

| | | |
|---|---|---|
| WO | WO 96/23263 | 8/1996 |
| WO | WO 00/39717 | 7/2000 |

OTHER PUBLICATIONS

Kamon, et al. "Interconnect parasitic extractioon in the digital IC design methodology" (IEEE, May 1999, 0-7803-5832-5/99; pp. 223-230).

DeepChip.com; "Two users question PrimeTime on its interface logic models (ILMs)" ; (Sep. 19, 2001), pp. 1-2.

DeepChip.com; J. Cooley, ESNUG topics; (Oct. 25, 2001), pp. 1-20.

R. Goering, "Models speed Synopsys timing analysis" ; (Nov. 27, 2001) www.eedesign.com, pp. 1-2.

"Hierarchical scan synthesis methodology using test models"; Synopsys, Inc. 2001, Oct. 2001, pp. 1-7.

A. Daga, "Automated timing model generation"; DAC 2002 New Orleans, LA, Jun. 10-14, 2002, (pp. 146-151).

Synopsys Product Guide 04: success one chip at a time; Synopsys Inc., Mountain View, CA 2003, 2004, 24 pages.

"Synopsys offers a complete static timing and signal integrity analysis solution for nanometer system-on-chip designs," Synopsys Inc., Mountain View, CA, 2003, pp. 1-5.

J. Cooley, Synopsys PrimeTime-Sitting Pretty, DEEPCHIP, www.deepchip.com, (Mar. 28, 2001).

Cadence Design Systems, Inc., Cadence Integration Ensemble, www.cadence.com/whitepapers/ie whitepaper, (2001).

Synopsis, Inc., Hierarchical Static Timing Analysis Using Interface Logic Models, www.synopsys.com/products/analysis/pt static timing wp, (2001), Jan. 2001.

* cited by examiner

REPRESENTING THE DESIGN OF A SUB-MODULE IN A HIERARCHICAL INTEGRATED CIRCUIT DESIGN AND ANALYSIS SYSTEM

CROSS-REFERENCE TO RELATED APPLICATION(S)

This application claims priority from a provisional patent application entitled "Representing the Design of a Sub-Module in a Hierarchical Integrated Circuit Design and Analysis System", filed on Jun. 8, 2001 and bearing Ser. No. 60/296,797 and claims the benefit of Provisional application No. 60/296,792, filed Jun. 8, 2001.

BACKGROUND

1. Field of the Invention

The invention is related to electronic circuit fabrication. More particularly, the invention is related to systems for designing and verifying the contents and layout of an integrated circuit.

2. Related Art

In Electronic Computer Aided Design (ECAD) software systems, an integrated circuit design specification and implementation data must be stored as a set of database records, and these records have some finite maximum size based on the virtual memory capacity of the computer on which the software is running. In addition, the execution time of the ECAD software normally increases with the size of the design. The data to represent a very large integrated circuit design may be too large to fit in a computer's memory, or the execution time required to design or simulate the entire design may be prohibitive. This is particularly true where the number of components (i.e. gates) and attendant connections within an integrated circuit are in the 10s or 100s of millions or more.

Hierarchical decomposition or "partitioning" is a technique which may be used to reduce the complexity of a large integrated circuit design specification so that the memory and/or execution time required to complete the design remains manageable. Instead of representing the design as a single flat database, the design is partitioned into pieces, often called "blocks", which can be designed and verified independently. With a given single level of hierarchy, the design specification consists of a set of blocks and the top-level interconnections between those blocks. With multiple levels of hierarchy the blocks may themselves consist of smaller sub-blocks and their interconnections.

Hierarchical decomposition may also be used simply as an organizational tool by a design team as a method for partitioning a design project among several designers. However, this logical hierarchy created by the design team in the design specification does not need to be the same as the physical hierarchy used to partition the design for implementation. Often the logical hierarchy is much deeper than the physical hierarchy. A process of block flattening may be used to transform the logical hierarchy into an appropriate physical hierarchy.

A conventional hierarchical design project typically proceeds in two major steps: a top-down block planning step followed by a bottom-up verification step. If the blocks themselves are implemented during the top-down phase (i.e. each block is implemented before its children) the flow is referred to as a top-down flow. Conversely, if the blocks are implemented during the bottom-up phase (i.e. each block is implemented after all of its children have been completed) the flow is referred to as a bottom-up flow. The top-down and bottom-up flows each have their advantages and disadvantages. Without loss of generality, a top-down flow is used as an example in the remainder of this document. A bottom-up flow could be implemented using identical techniques.

FIG. 1 shows a typical top-down block planning and implementation flow. It begins with a partitioning of the design netlist to map the logical hierarchy into the physical hierarchy, defining the top-level block and the set of sub-blocks to be implemented (step 110). Each sub-block is then assigned a width and height value and a placement in the floorplan (step 115). Locations are then assigned to the pins on each sub-block, which represent the locations where nets cross the sub-block boundaries (step 120). This is followed by a time budgeting step that assigns signal arrival/required time constraints to each sub-block pin, indicating which portion of the clock cycle is allocated to the timing paths that cross the sub-block boundaries (step 135).

At this point in a top-down flow, after the top-level block has been planned, the process is prepared to implement the block. All leaf-cells (standard cells and macros) owned by the block are assigned a placement, and all nets owned by the block are routed (step 140). If any of the nets were routed over the sub-blocks (so-called "feedthrough nets") these wires are pushed down into the sub-blocks that they overlap, and new pins are created on the sub-block where the wires cross the sub-block boundaries (step 145). Then, recursively implement the sub-blocks according to the same process (step 150). This involves recursively performing steps 110 to 170 while treating each sub-block as the top-level block.

For the above process to complete successfully the shapes, pin locations, and timing budgets assigned to each block (steps 115 through 135) must represent achievable constraints. Otherwise the system may not be able to complete the implementation of some blocks according to their specifications. In such a case the specifications may need to be refined and the top-down process may need to be repeated before a correct implementation can be realized. Such an iterative refinement is time-consuming and should be avoided. Thus, methods for achieving high-quality results in these steps are of critical importance.

When the recursive top-down planning and implementation step is complete the bottom-up verification process can commence. Proceeding from the lowest-level blocks toward the top-level, each block is independently analyzed for logical correctness, as well as its timing and electrical performance, and compared against its specification (step 155). After all sub-blocks of a block have been independently verified the block itself can be analyzed (step 170), under the assumption that the sub-blocks are correct.

SUMMARY OF THE INVENTION

In various embodiments, the invention consists of the creation and use of a reduced model, referred to as a block "abstraction", that captures the structure and behavior of the block in sufficient detail that the interface with its parent block and its sibling blocks may be correctly analyzed. The goal of the abstraction is to reduce the amount of memory required to represent a block to its ancestors in the hierarchy, and reduce the amount of execution time required to analyze each instance of the block in the context of its parents and sibling blocks.

BRIEF DESCRIPTION OF THE DRAWINGS

These and other objects, features and advantages of the present invention are better understood by reading the following detailed description, taken in conjunction with the accompanying drawings, in which.

DETAILED DESCRIPTION

Figure 1:
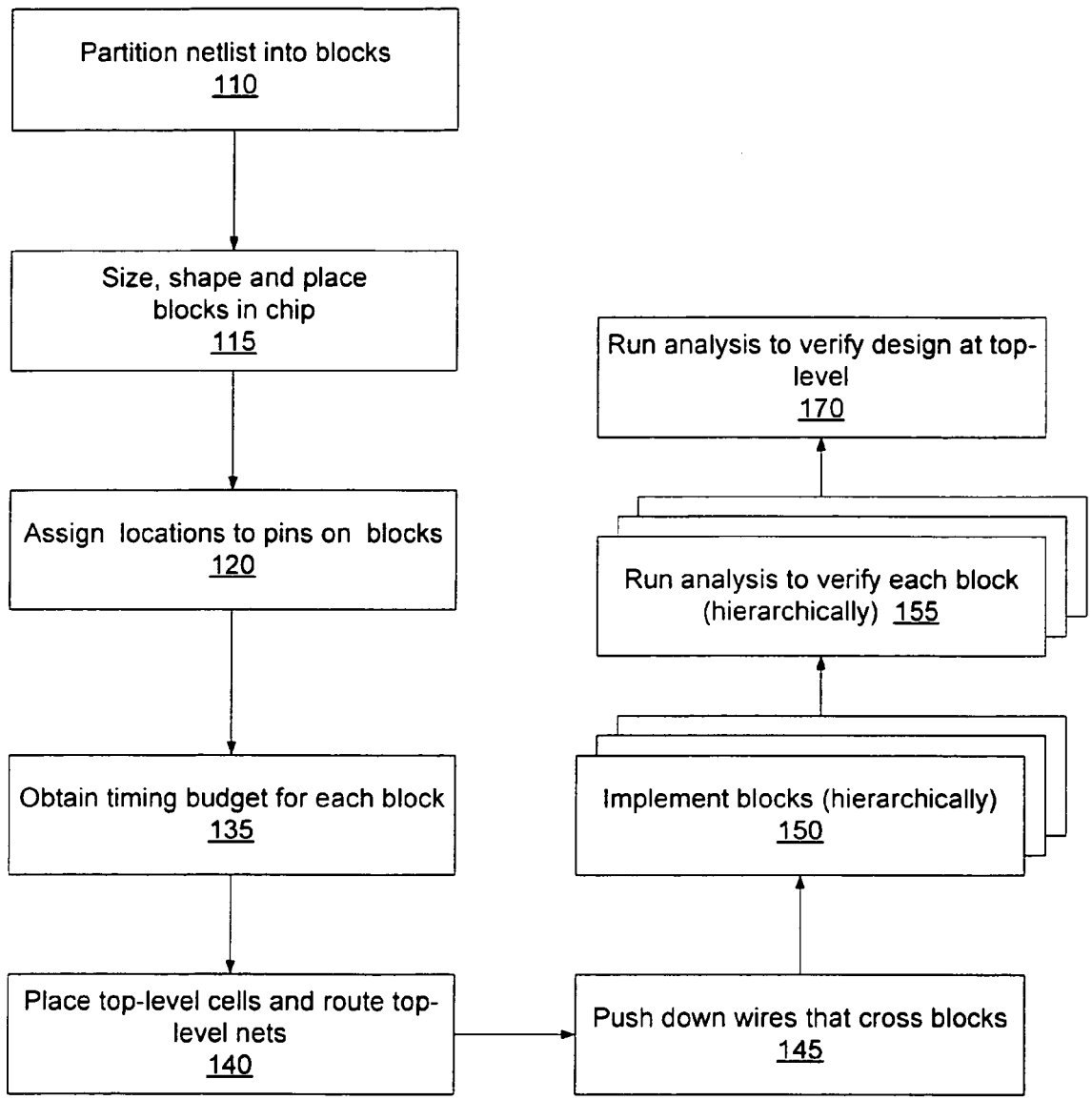
FIG. 1 shows a typical top-down block planning and implementation flow.
Figure 2:
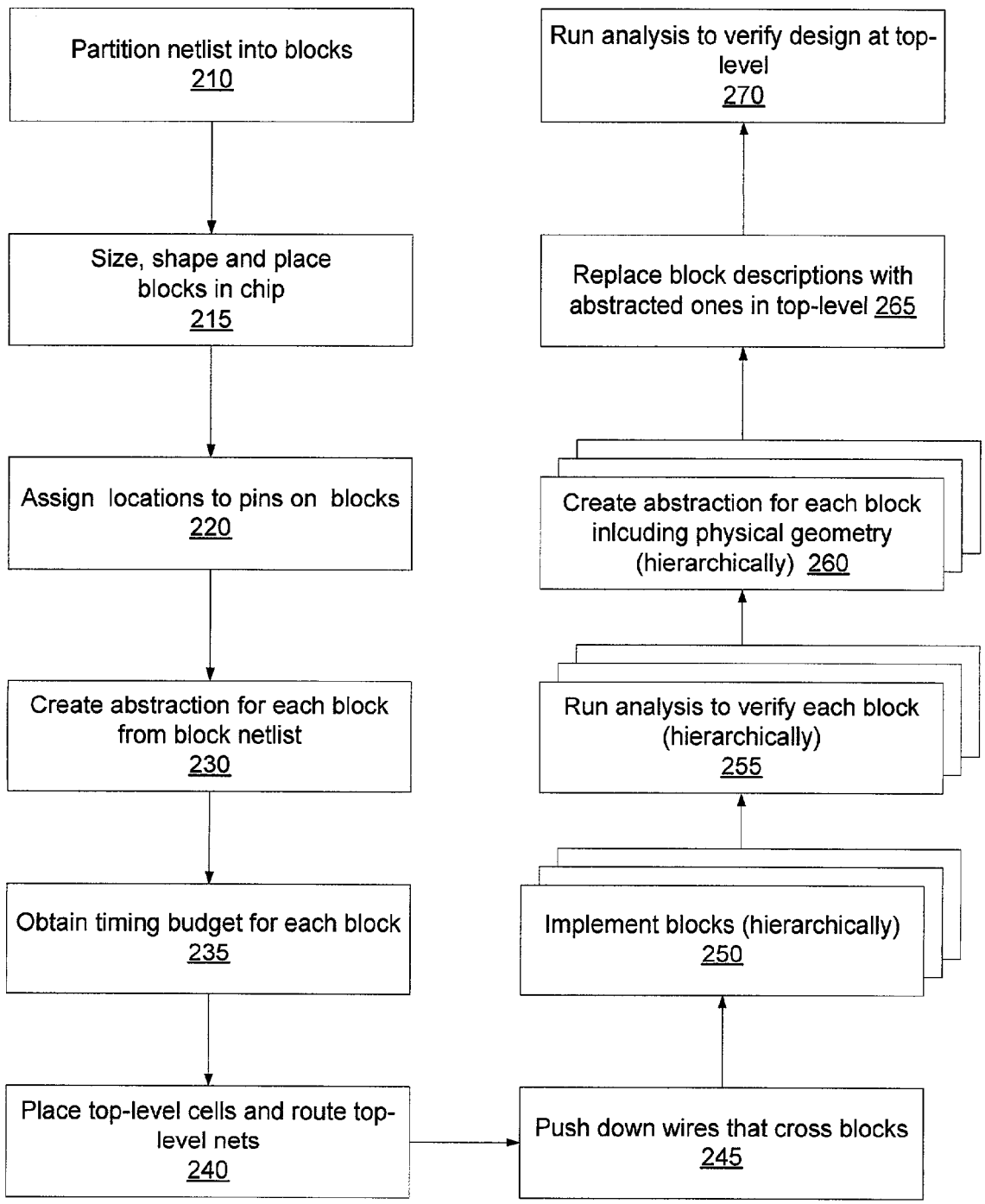
FIG. 2 illustrates a hierarchical design process according to one or more embodiments of the invention.

One way of implementing the top-down hierarchical design process is the hierarchical design flow shown and described in FIG. 2. The design flow shown in FIG. 2 is a refinement of the top-down flow shown in FIG. 1, with three additional steps, 230, 260, and 265. The refinement concerns a method for modeling a sub-block, in the context of its parent and sibling blocks, during the top-down budgeting and block implementation steps, as well as the bottom-up verification steps. These steps represent places in the flow at which the clean hierarchical boundaries are violated and there is a need for cross-boundary analysis. Without an effective technique for managing this cross-boundary analysis the primary advantage of the hierarchical design process—its ability to reduce the memory and runtime required to design a large integrated circuit—may be lost.

During the top-down budgeting step one objective is to analyze the combinational logic paths (logic gates between latches and/or flip-flops) that cross one or more hierarchical boundaries, and determine what fraction of the clock cycle should be budgeted for each segment of the path.

During the top-down block implementation step a block is placed and routed before its sub-blocks have been implemented. In most cases the placement and routing is fairly decoupled across hierarchical boundaries. However, many modern manufacturing processes require the routing wires to obey a set of rules called "antenna rules" that require detailed knowledge of the routing wires present on both sides of a hierarchical boundary.

During the bottom-up verification process there is also a need to analyze the combinational logic paths that cross the hierarchical boundaries. When analyzing a block that contains sub-blocks, it would be desirable to take advantage of the fact that the sub-blocks have been pre-verified, avoiding the need to re-analyze the sub-blocks while analyzing their parents.

To address these three cases the invention discloses, in various embodiments, the use of a reduced model, referred to as a block "abstraction", that captures the structure and behavior of the block in sufficient detail that the interface with its parent block and its sibling blocks may be correctly analyzed. The goal of the abstraction is to reduce the amount of memory required to represent a block to its ancestors in the hierarchy, and reduce the amount of execution time required to analyze each instance of the block in the context of its parents and sibling blocks.

As mentioned above, in this regard, the hierarchical design flow of FIG. 1 is supplemented and enhanced by additional steps 230, 260, and 265. In step 230, prior to the time budgeting step, abstractions of each sub-block are created for use during budgeting. Because the sub-block has not yet been implemented it contains no physical implementation data, only its netlist description. Therefore the abstraction used during budgeting is intended to model the logical behavior of the sub-block only, details of the physical and electrical behavior are not yet available. This initial abstraction is used during budgeting and then discarded.

After time budgeting, placement and routing, wire pushdown, block implementation and block verification (steps 235, 240, 245, 250 and 255), a second abstraction for each block is created (step 260.) As the block implementation is now complete this abstraction must model the detailed physical and electrical properties of the block as well as its logical behavior.

Since the verification process is occurring bottom up, all of a block's children are independently verified before the block itself is verified. During the verification of a block, all of its sub-blocks are replaced with their abstractions (step 265), thus taking advantage of the fact that most of the sub-block's implementation and behavior has already been verified. Only those combinational logic paths that cross the hierarchical boundary remain to be verified. The data reduction provided by the abstraction will significantly speed up the verification of the blocks and reduce the memory requirements while moving up through hierarchy.

While steps 210, 215, 220 are similar in operation to blocks 110, 115, and 120, respectively, all other steps 230–270, are enhanced in that they deal with abstractions of the design rather than the raw design itself.

One key difference between a top-down block implementation flow and a bottom-up block implementation flow is that, in the former, a block is implemented before its children, while in the latter a block is implemented after its children. The hierarchical implementation flow in FIG. 2 would be modified to place blocks 240 and 245 between blocks 265 and 270. The main impact is that, in a top-down flow, the top-level block is being implemented before the implementation of its children is complete. Therefore the invention makes use of the sub-block budgets as idealized optimization target while implementing their parent. In a bottom-up flow, on the other hand, a block must be implemented before its parent's or sibling block's implementations are known. It must therefore also make use of its timing budget as an idealized optimization target.

The described abstraction mechanism is equally applicable when used in a bottom-up implementation and verification flow as in a top-down implementation flow when only verification is being performed bottom-up. However, in a bottom-up implementation flow the use of an abstraction to model the completed sub-blocks, rather than an idealized budget, may result in a higher quality implementation of its parent's block. Detailed below is an "inverse abstraction" mechanism which permits the same benefit to be realized in a top-down flow.

Existing methods for block abstraction rely on reduced behavioral models to capture approximate behavioral descriptions of the logical, physical, and electrical behavior of the block. These are normally represented as mathematical models associated with each pin. For example, the logical description of each pin may be described with a Binary Decision Diagram (BDD). The electrical description of each pin may be captured with a linearized RC-network reduced to a fixed number of moments. Currently, there are no known methods for creating a reduced model of the physical information needed to represent a pin's antenna parameters. The lack of an effective abstraction for this latter application usually requires a constructive antenna avoidance technique, such as diode insertion at each pin, that results in reduced circuit performance.

The use and application of the abstraction mechanism to be described below leads to a truly consistent and unified approach to timing analysis, electrical analysis, placement and routing, and budgeting, which are all interdependent upon each other. Furthermore, it guarantees complete accuracy, unlike the traditional abstraction mechanisms which rely on approximate mathematical models.

Timing Analysis

Static timing analysis is mainly concerned with calculating the propagation time of data signals between latches and/or flip-flops. This information is used both for the optimization of the logic in the parent block, and the verification of the timing of the child blocks in the context of their siblings and parent. If a combinational logic path crosses one or more To hierarchical boundaries, an accurate timing analysis can only be performed when path information is available for all segments of the path through all levels of the hierarchy. From a static timing perspective, as long as the block abstraction presents the same timing characteristics at the boundary of the lower level block to the higher level block, the higher level block cannot recognize the difference between a reduced model and the full model. The timing characteristics that must be captured by the lower level block are the required times at the primary input pins and arrival times at the primary output pins.

These two pieces of information could be calculated in advance if one knew a-priori the exact operating environment of each block. However, because the verification flow is proceeding bottom-up, the higher level block cannot precisely supply this information. The child block's input slew and output-loading information are not accurately known. In addition, information such as timing exceptions may be impossible to represent with such a simple model.

It is possible to model slew and load effects with pre-extracted linear delay models, or by constructing lookup tables from multiple analysis runs on the lower level block with varying slew and load values. However, these reduced models will be somewhat inaccurate, it is not possible to accurately model the interconnect network until the exact driver and receiver locations and routing topology have been determined, and it is not possible to account for signal-dependent delays or the effects of signal coupling (crosstalk delay and noise injection).

Electrical Analysis

Electrical Analysis is concerned with verifying that the block and its individual components will not deviate from their idealized electrical properties during operation. Two examples of the effects that must be modeled include IR-drop and electromigration.

IR-drop, encompassing the effects of supply voltage drop and ground-bounce, measures non-ideal behavior on the power and ground supply networks. The wires making up the supply distribution network have non-zero resistance, and large current loads could cause the supply voltages to deviate from their specified ranges at various points along these wires. This effect can result in unexpected changes in the timing behavior of a circuit, and in the extreme case could result in a complete failure of the circuit to operate.

Electromigration failures also result from high current densities in non-ideal resistive wires. However, unlike IR-drop, these failures result in physical rather than electrical changes in the wires. Over the lifetime of the integrated circuit these high currents can cause metal atoms to migrate from their original positions and this can lead to short circuits and open circuits that did not exist at manufacturing time.

The results of the IR-drop analysis, if it indicates a failure, may be used as feedback on the design of the power distribution network. It may also be used to enhance the accuracy of the timing analysis, which was described above. The results of the electromigration analysis, if it indicates a failure, may be used to influence the implementation of the circuit itself, requiring changes to the circuit netlist or changes in the widths (resistances) of the wires that are used during routing.

Both of these electrical effects require a detailed analysis of the exact voltages and currents that will be seen on each wire of the circuit. Depending on the model used to measure and predict the failures, this analysis may be a static or average case analysis, or it may require dynamic time-domain logic or circuit simulations. As with static timing analysis, these effects must be modeled in the abstraction.

Placement and Routing

Placement deals with how blocks and sub-blocks are physically arranged on an integrated circuit while routing refers to how they are interconnected. The physical placement of a block and the routing to its pins requires fairly minimal information about the block's physical construction. A block's pin geometries provide the set of legal locations at which the router is permitted to connect to the pins. The remainder of the block's internal geometries can normally be represented by a greatly reduced set of blockages that prevent the routing in the parent block from creating short circuits or design-rule violations to the cells and routing inside the block.

However, modern deep-submicron manufacturing technologies (technologies with minimum feature sizes less than about 250 nanometers) have added one complication to this model. The detection and repair of antenna-rule violations requires detailed knowledge of the routing wire topologies that connect driving and receiving gates across the hierarchical boundaries, plus knowledge of all transistor gates, sources, and drains which connect to these wires.

Budgeting

In general, to obtain an optimal and achievable budget for a sub-block, a static timing analysis must be performed on all logic paths that cross the block's hierarchical boundary. This analysis must reach all registers visible from the sub-block pins, whether they belong to the parent block, the sub-block, or one of the sub-block's sibling blocks in the hierarchy. One advantage is that all combinational paths completely contained within the sub-block can safely be ignored, greatly reducing the expense of this analysis.

If the budgeting step is permitted to perform cross-boundary logic optimization, as well as static timing analysis, there is a potential to implement a truly optimal budget assignment. Such a technique is described in a co-pending patent application entitled "Method for Generating Design Constraints for Modules in a Hierarchical Integrated Circuit Design System," filed on Jun. 10, 2002 (attorney's reference number 054355-0293259).

The Block Abstraction Process

One central aspect of this invention, as described below, is the method for block abstraction that accomplishes the desired logical and physical data reduction step while conforming to the requirements outlined above. The key idea is to represent the design, not with a simplified mathematical model of reduced accuracy, but as a sub-set of the design data itself. The reduced model consists of a copy of the original model, but with all non-essential information discarded. Stated another way, the abstraction is built by copying only those elements of the logical netlist and physical block implementation that are needed to model the block correctly in the context of its parent and sibling blocks in the hierarchy, thus achieving a large reduction in the quantity of the block's data.

The remainder of this document details the logical netlist objects and physical layout objects that are included in a hierarchical block abstraction in order to model the block's logical and physical characteristics, including such critical physical effects such as antenna rules, resistance-capacitance (RC) wire delay, crosstalk, noise injection, IR-drop, and electromigration effects. A block modeled with such an abstraction can be used for top-down budgeting, bottom-up static timing and electrical analysis, as well as either top-down or bottom-up block implementation, with essentially complete accuracy. This level of accuracy is achievable by selectively retaining only the subset of the data in each block that cannot be analyzed independently of its parent and/or sibling blocks. The data that is retained may consist of logical (netlist) data, design constraints, and physical (layout) data. By including the physical objects themselves instead of simplified or worst-case models for them, no accuracy is lost.

Figure 3:
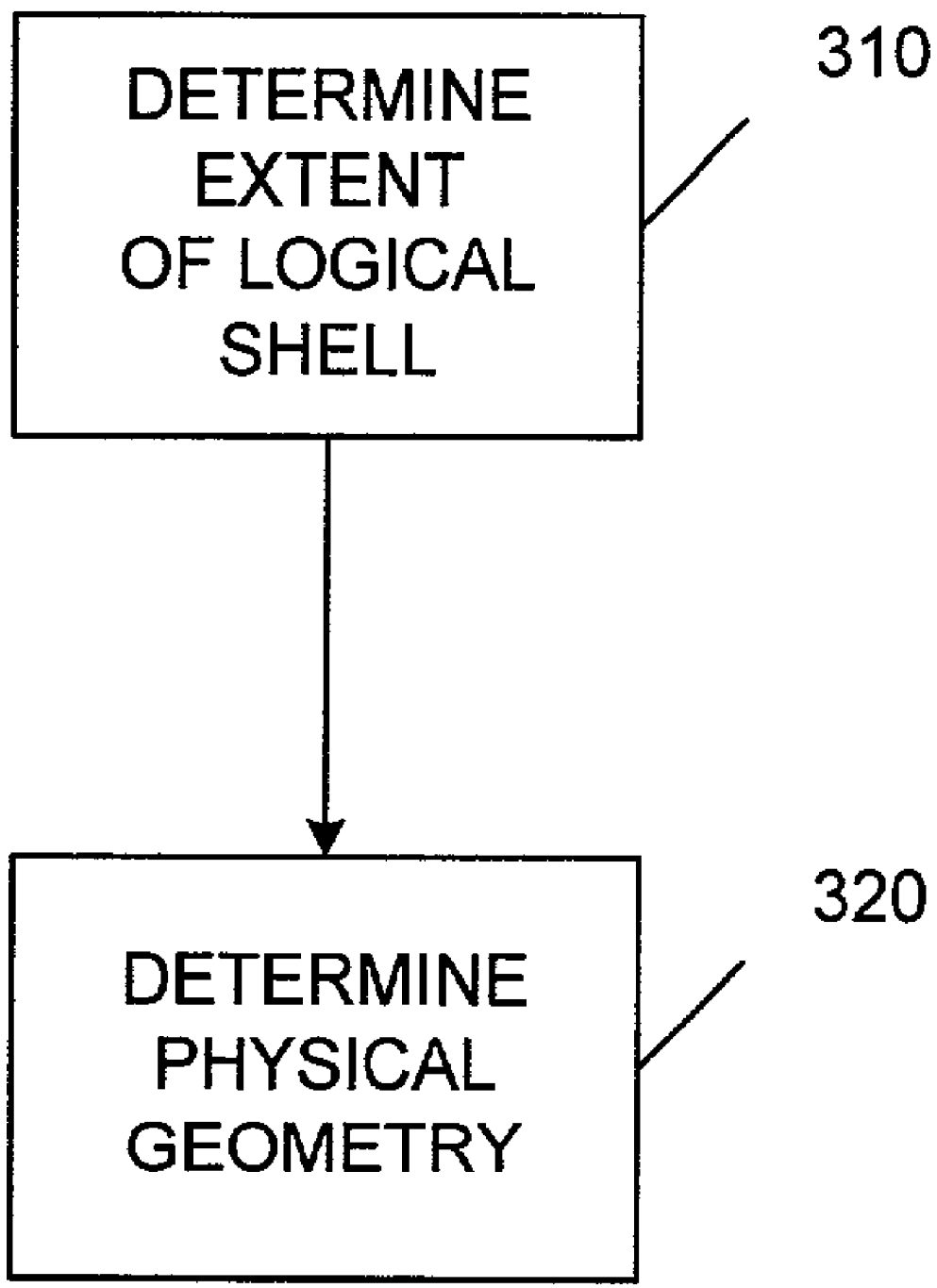
FIG. 3 illustrates the abstraction process according to at least one embodiment of the invention.

The abstraction process can be viewed as consisting of two major steps as shown in FIG. 3. First, according to step 310, begin by determining the extent of the block's logical "shell". This is the set of cells that are reachable along a combinational path from the block's input and output pins, inclusive of the first latch or flip-flop encountered along each path. The set must also include some additional cells that are necessary to provide accurate capacitive loading information for the previously mentioned cells. Cells that are completely register bounded within the block can have no effect on the external timing of the block, and are therefore not included in the logical shell. The contents of this logical shell are determined with a graph traversal and labeling algorithm discussed in the following sections.

After the contents of the logical shell are determined, then, in step 320, the set of physical geometries that must be retained in the abstraction is determined. These are required to model the resistance and capacitance of the nets in the logical shell, as well to model the effects of crosstalk delay and noise injection. As shown below, there may also be a requirement to include some additional cells in the logical abstraction in order to model these effects.

Figure 4:
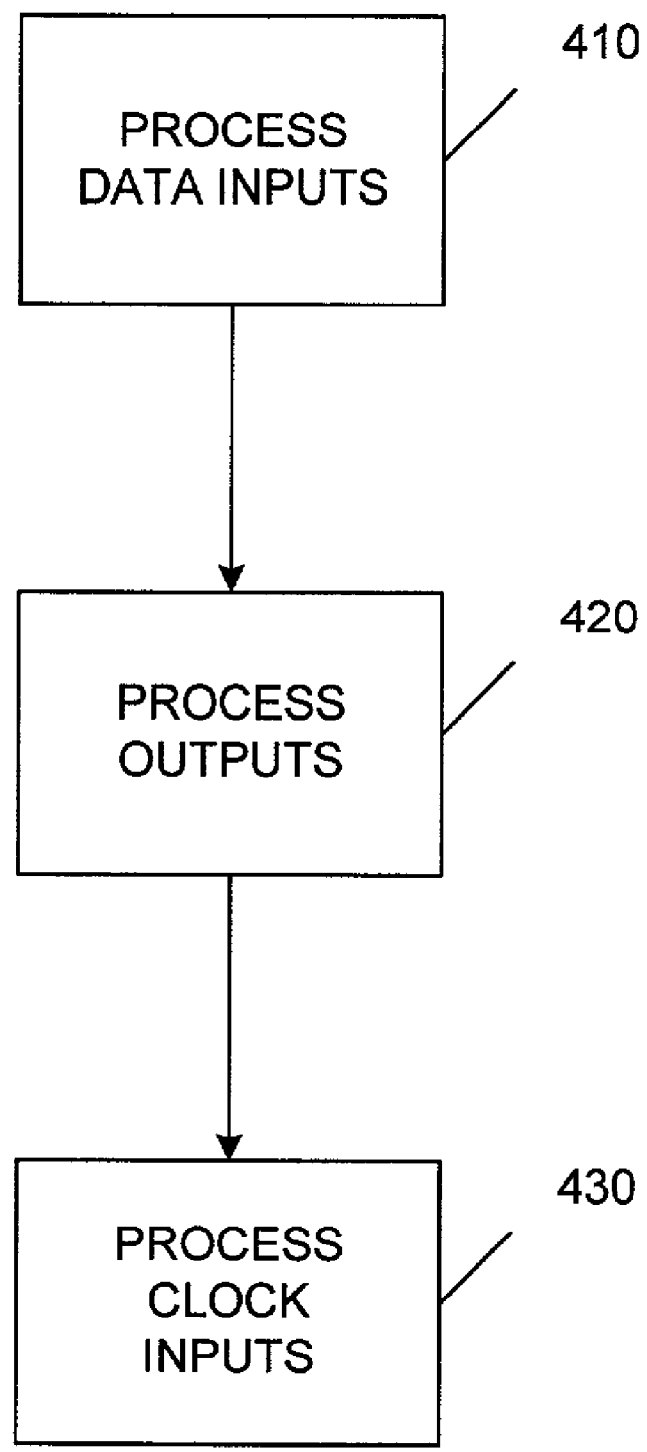
FIG. 4 illustrates the logical shell labeling process according to at least one embodiment of the invention.

FIG. 4 is a detailed flowchart of Step 310, logical shell labeling, according to at least one embodiment of the invention. The contents of the logical shell are determined with an algorithm that labels the nodes in the block's timing graph. The timing graph is a directed graph that is built from information in:

(1) the netlist (a description of how cells are connected to one another);

(2) the cell library (a description of how information flows through the cells); and (3) the timing constraints (a description of the clocks, timing exceptions, and broken edges).

The graph nodes represent cell pins, and the edges represent nets connecting those pins. To restate, the goal of labeling is to retain only the cells necessary to provide the same timing graph in the shell model as is present in the full model, when viewed from the primary pins.

Logical shell labeling begins with a depth-first traversal originating from the data (non-clock) primary input pins within the logical shell (block 410). Next, a depth-first traversal originating from the primary output pins is performed (block 420). Finally, in accordance with block 430, a depth-first traversal originating from the clock (non-data) primary input pins is performed.

The cells that are encountered during these depth-first traversals are given labels according to the following rules (note that a cell is allowed to have more than one label):

1) Timing cell:
Defined as a cell that is reachable from a primary input or output pin. Collectively, these cells define the timing graph that is visible from the primary pins.

2) Multi-driver load cell:
Defined as a cell that drives the same net as a timing cell that is not itself a timing cell.

3) Sink load cell:
Defined as a cell that is driven by a timing cell that is not itself a timing cell, when the driving cell is not part of the clock network.

4) Clock load cell:
Similar to the sink load cell except the driving cell is part of the clock network.

Figure 5:
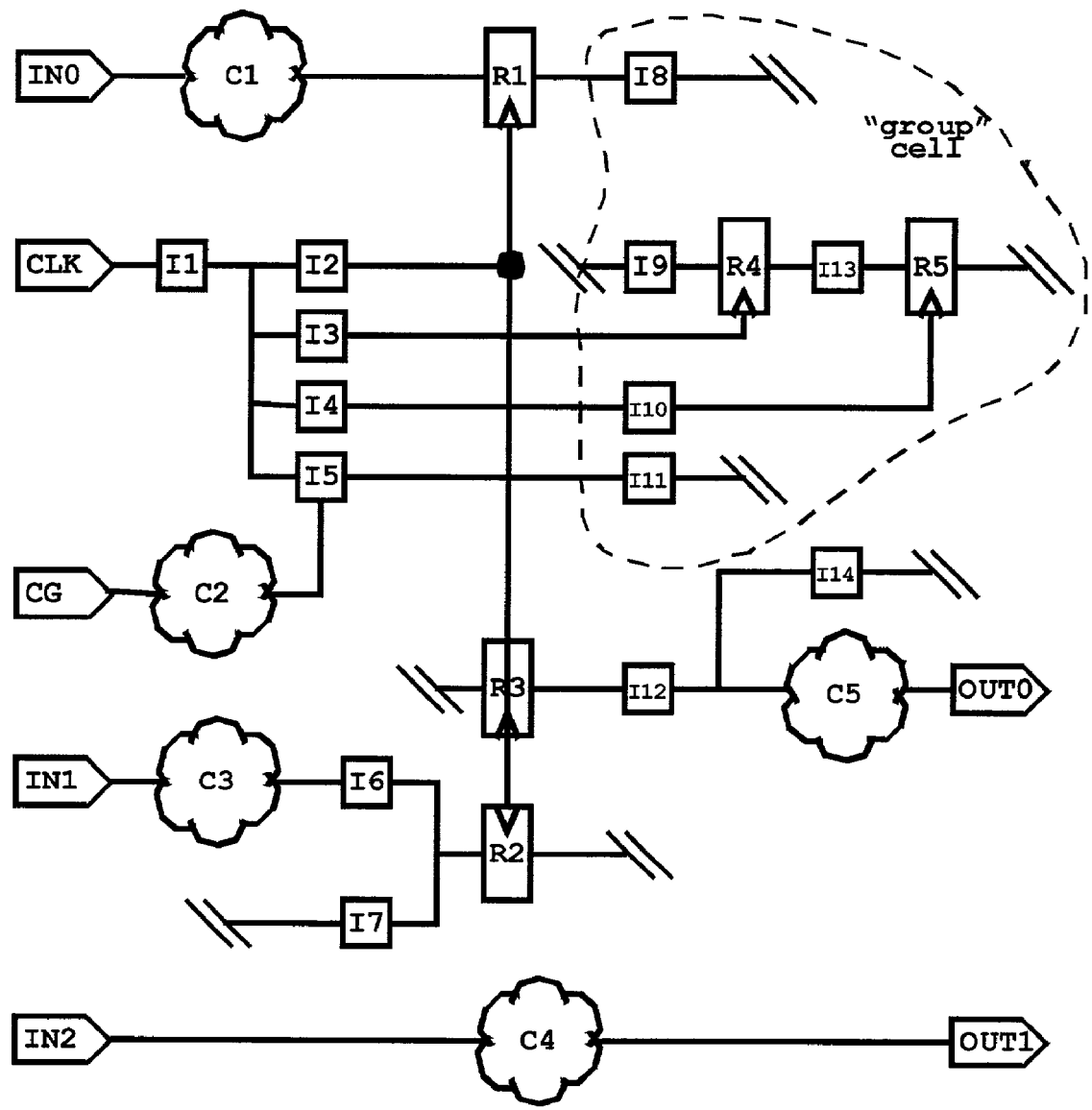
FIG. 5 illustrates a block which undergoes this labeling process.

FIG. 5 illustrates a block which undergoes this labeling process. In the exemplary block being illustrated, the following components are given by the input specification. The block consists of one primary clock input pin: CLK; four primary data input pins: CG, IN0, IN1 and IN2; and two primary outputs: OUT0 and OUT1. Cells R1, R2, R3, R4, and R5 are register (flip-flop) elements. Components C1, C2, C3, C4 and C5 are arbitrary combinational logic circuits (groups of connected cells). Cells I1, I2, I3, I4, I5, I6, I7, I8, I9, I10, I11, I12, I13 and I14 are instances of individual combinational logic gates.

The cell labeling process is based upon being able to identify every cell pin as either a clock pin or a data pin. By definition, if a pin is not a clock pin it is a data pin. This labeling is a standard part of any static timing analysis algorithm and will not be described here. According to the static timing algorithm, all pins on cells I1, I2, I3, I4, I10, and I11 are identified as clock pins. In addition, the upper input pin on cell I5 and the output pin on I5 are identified as clock pins. Further, the pins attaching to cells R1, R2, R3, R4 and R5 that are marked with a triangle are labeled as clock pins. The cell labeling process as applied to the exemplary circuit of FIG. 5 is detailed below.

Input Pin Labeling

The labeling process starts with the data (non-clock) primary inputs. A recursive depth-first traversal is performed originating at each such pin, in an arbitrary order. The recursion terminates when either a leaf in the graph is encountered (a pin that has no successors, for example the data pin of a flip-flop or a primary output) or the pin encountered is a clock pin. The cells encountered during each traversal are labeled as timing cells (recall that the nodes in the timing graph are the cell pins.) Cells that have their output tied to a timing cell output are labeled as multi-driver load cells.

One example of such a multi-driver load cell is a tri-state driver (cells I6 and I7 of FIG. 5).

Figure 6:
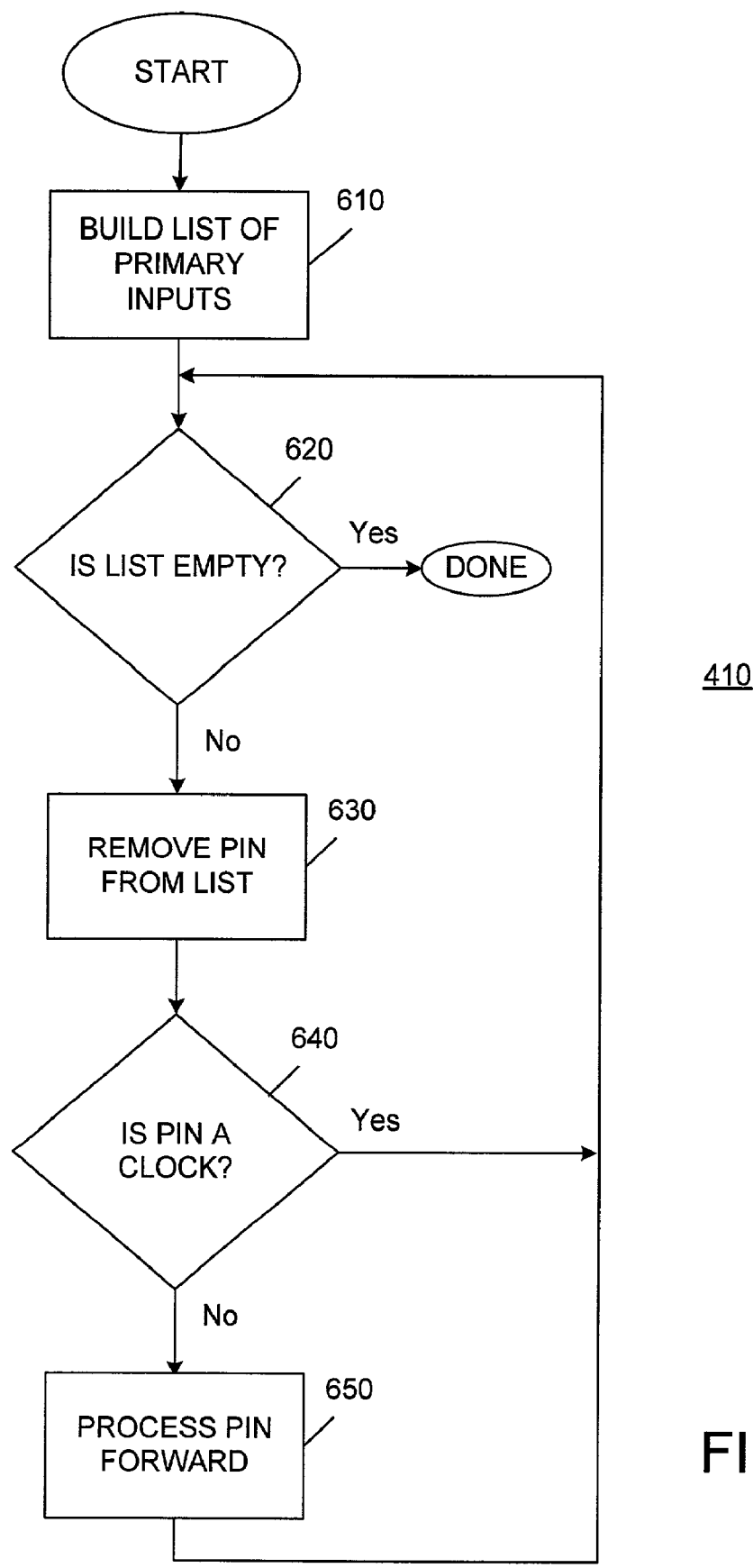
FIG. 6 summarizes the process data inputs step of FIG. 4.
Figure 7:
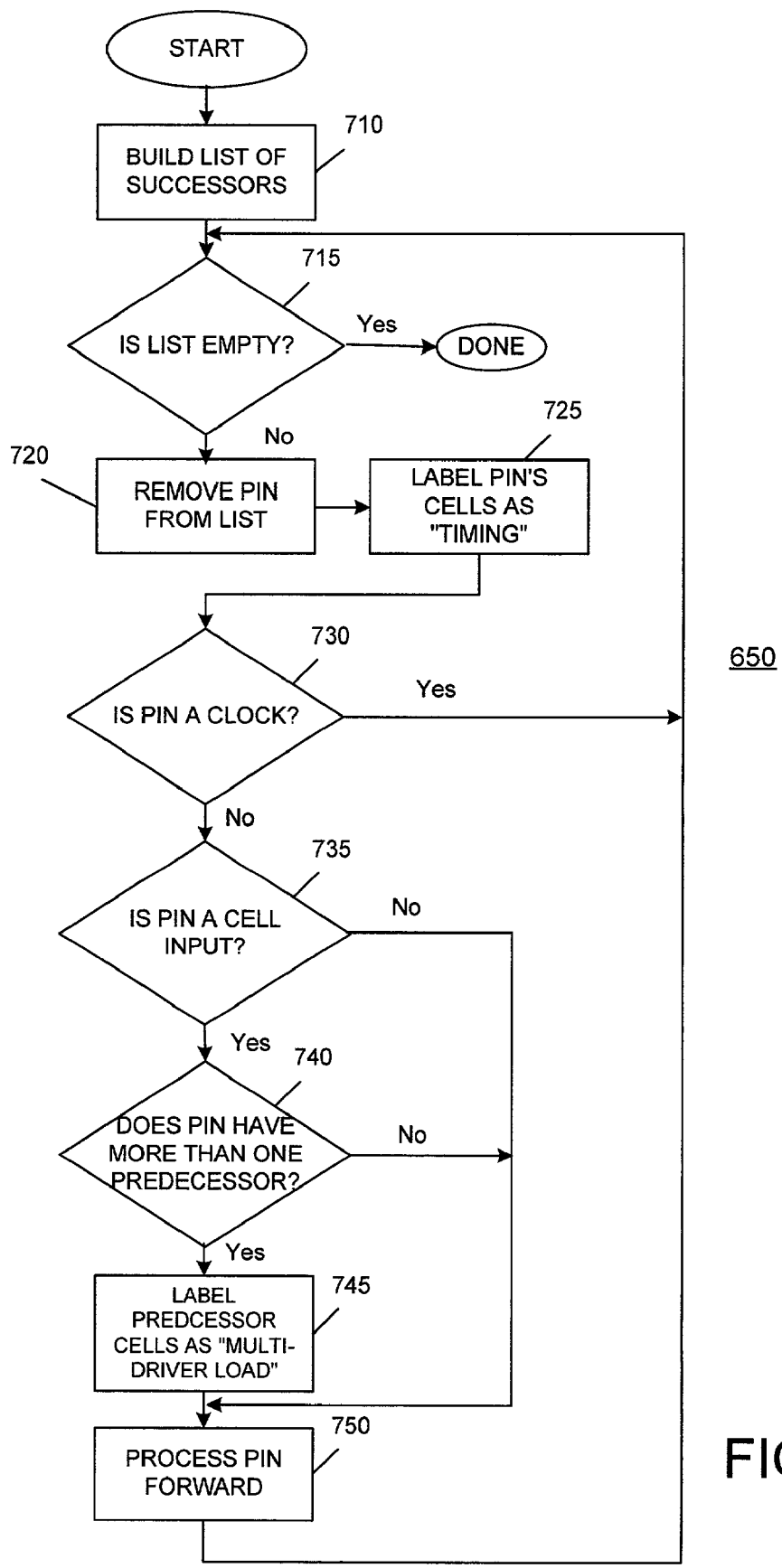
FIG. 7 summarizes the process pin forward step shown in FIG. 6.

This process is summarized in FIGS. 6 and 7. FIG. 6 summarizes the process data inputs step (410) of FIG. 4. The process begins by building a list of all primary inputs (block 610) to the circuit and continues until the list is empty (checked at block 620). After a pin is removed from the list (block 630) it is skipped if it is a clock pin (checked at block 640) and processing continues with the next pin (blocks 620 through 640, again). If not a clock pin (checked at block 640), then main forward processing of the pin occurs in block 650, which is described in detail in FIG. 7.

The process described in FIG. 7 is a recursive process with the recursion occurring in block 750. Processing begins by collecting all successors of the starting pin in a list (block 710) and continues until the list is empty (checked at block 715). After a pin is removed from the list (block 720) the cell for this pin is labeled as a "timing" cell (block 725). If the pin is a clock pin no further processing is required (checked at block 730). If the pin is an input pin (checked at block 735) then determine if the pin has more than one predecessor (checked at block 740). If more than one predecessor is found (checked at block 740) all predecessor cells are labeled as "multi-driver load" cells (block 745). The flowchart performs a depth-first recursion by calling itself in block 750.

Referring to an example circuit shown in FIG. 5, the input-labeling algorithm would proceed as follows. Starting from input pin IN0, the depth-first traversal encounters component C1 and the register R1, with the traversal terminating at register R1. All of the cells within component C1 and register R1, which are contained within this traversal, are labeled as timing cells. Likewise, starting from input CG, all the cells within component C2 and the cell I5 are labeled as timing cells. Traversal terminates at I5 because the output of I5 is a clock pin (I5 is a "clock gating" cell). Starting from input pin IN1, all cells in the component C3 are labeled as timing cells. In addition, cells I6 and register R2 are labeled as timing cells. Cell I7 is labeled as a multi-driver load cell since its output is tied to the output of another timing cell. Starting from input pin IN2 all cells in component C4 are labeled as timing cells. The input labeling would at this point be considered complete.

Output Pin Labeling

Output labeling then proceeds, in a similar way, using a depth-first traversal that originates at the primary output pins. Again the recursion terminates when a leaf pin is encountered in the graph, or the pin encountered is a clock pin. And again, the cells encountered along the traversal are labeled as timing cells. One difference from the input labeling algorithm is that the sink-load cells, defined as cell whose source comes from a timing cell that is not part of the depth first traversal, need to be identified.

Figure 8:
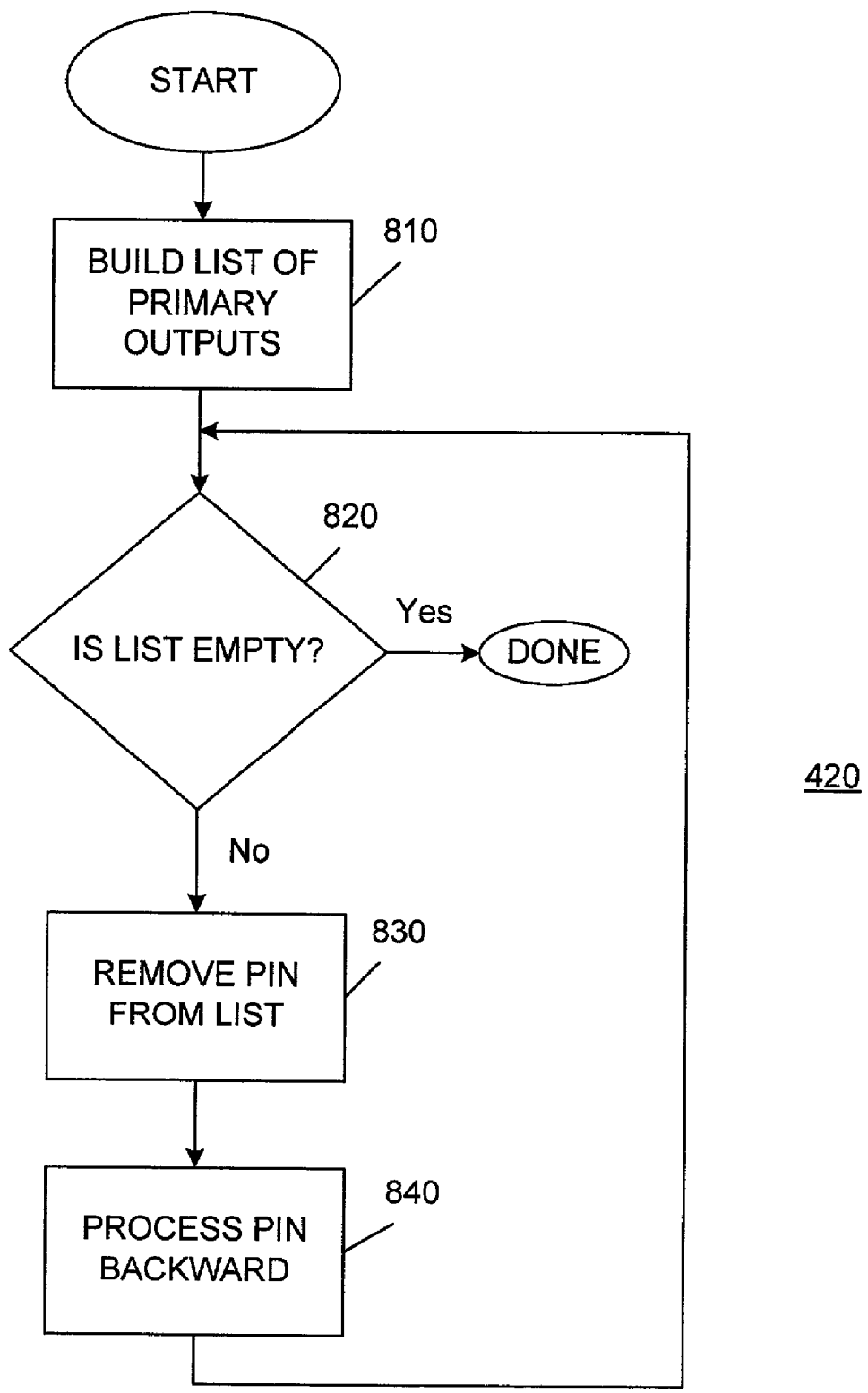
FIG. 8 summarizes the process outputs step of FIG. 4.
Figure 9:
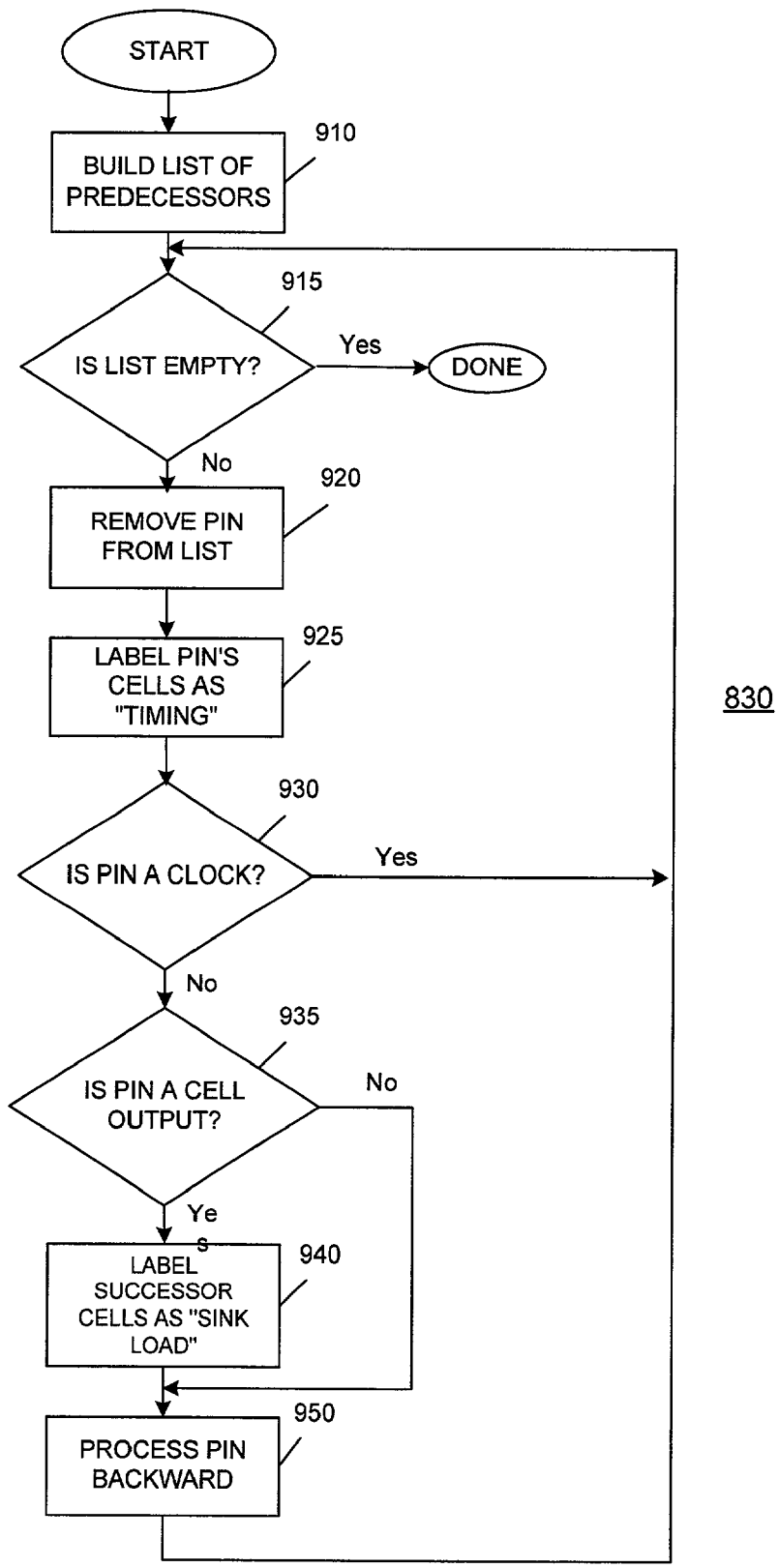
FIG. 9 summarizes the process pin backward step shown in FIG. 8.

This process is summarized in FIGS. 8 and 9. FIG. 8 summarizes the process outputs step (420) of FIG. 4. The process begins by building a list of all primary outputs (block 810) to the circuit and continues until the list is empty (checked at block 820). After a pin is removed from the list (block 830) it is processed by block 840, which is described in detail in FIG. 9.

The process described in FIG. 9 is a recursive process with the recursion occurring in block 950. Processing begins by collecting all predecessors of the starting pin in a list (block 910) and continues until the list is empty (checked at block 915). After a pin is removed from the list (block 920) the cell for this pin is labeled as a "timing" cell (block 925). If the pin is a clock pin no further processing is required (checked at block 930). If the pin is an output pin (checked at block 935) then label all predecessor cells as "sink load" cells (block 940). The flowchart performs a depth-first recursion by calling itself in block 950.

Referring again to FIG. 5 as an example, starting from output pin OUT0, all cells in component C5 are labeled as timing cells. Cell I12 and register R3 are also labeled as timing cells. Starting from output OUT1, all cells in component C4 are labeled as timing cells. The output labeling would at this point be considered complete.

Clock Pin Labeling

The final labeling step involves a depth-first traversal which originates from the primary clock inputs. In this case the traversal terminates when either a leaf pin in the graph is encountered, or the pin encountered is a data pin. When the traversal ends at a data pin, a check is made to see if the pin's cell is already labeled as a timing cell. Only when the traversal ends at a cell labeled as a timing cell are the cells on the path to that cell labeled as timing cells. During the traversal, a cell whose source comes from a timing cell that is not labeled as a timing cell is marked as a clock load.

Figure 10:
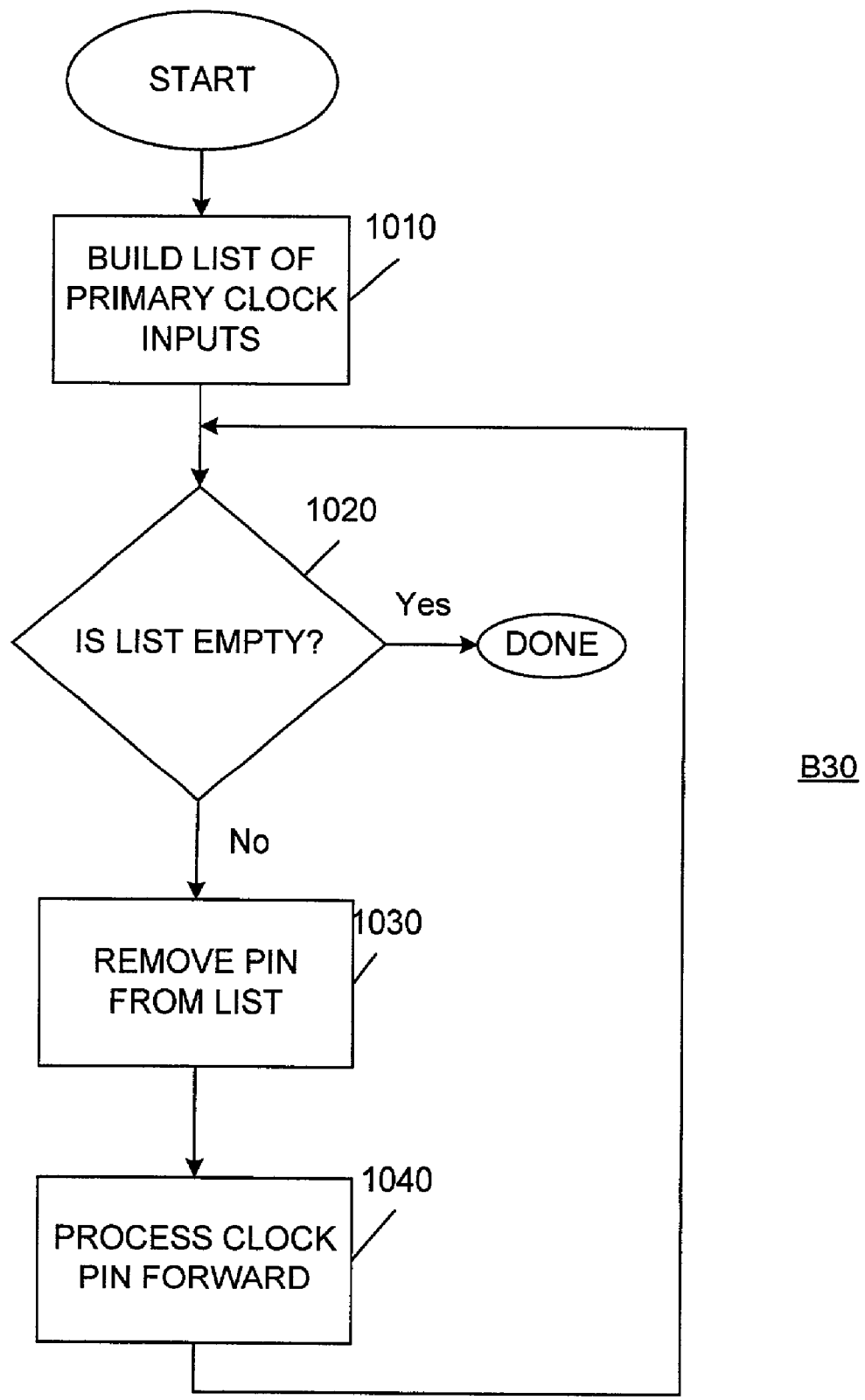
FIG. 10 summarizes the process clock inputs step of FIG. 4.
Figure 11:
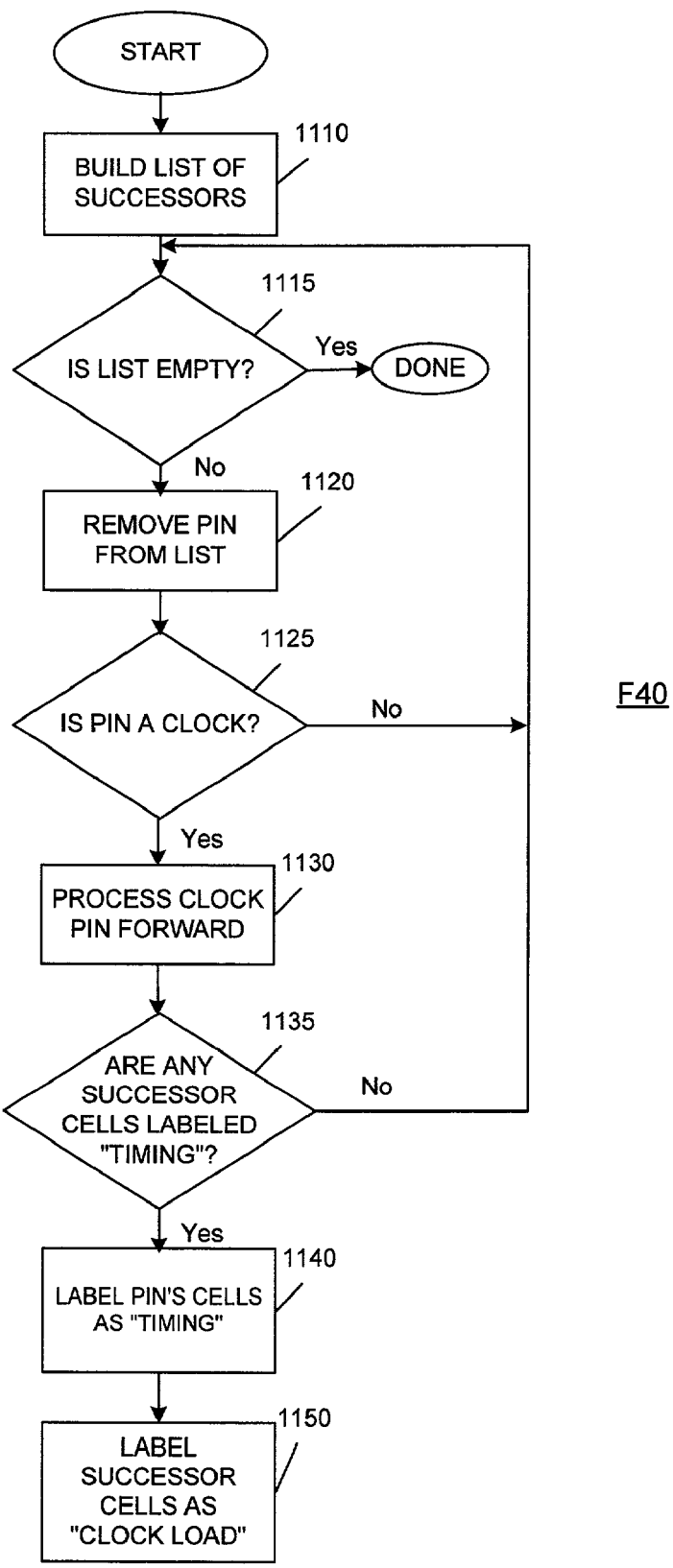
FIG. 11 summarizes the process clock pin forward step shown in FIG. 10.

This process is summarized in FIGS. 10 and 11. FIG. 10 summarizes the process clock inputs step (430) of FIG. 4. The process begins by building a list of all primary clock inputs (block 1010) to the circuit and continues until the list is empty (checked at block 1020). After a pin is removed from the list (block 1030) it is processed by block 1040, which is described in detail in FIG. 11.

The process described in FIG. 11 is a recursive process with the recursion occurring in block 1130. Processing begins by collecting all successors of the starting pin in a list (block 1110) and continues until the list is empty (checked at block 1115). After a pin is removed from the list (block 1120) a check is made to identify it as a clock (block 1125). If the pin is not a clock pin no further processing is required (back to block 1115). The flowchart performs a depth-first recursion by calling itself in block 1130. Upon returning from the recursive call a check is made to determine if any successors of the pin were labeled as "timing" during the recursion (checked at block 1135). If no successor cells were labeled as "timing" cells, no further processing is required (back to block 1115). If any successor cells are labeled as "timing" cells the pin's cell is labeled as a "timing" cell (block 1140) and all successors cells are labeled as "clock load" (block 1150). At the end of block 1150 the process terminates since the pin's cell has been labeled as a "timing" cell.

Again, referring to the example in FIG. 5, starting from input pin CLK, traversal would be through cells I1 and I2 and then end at cells R1, R2, and R3. Thus cells R1, R2 and R3 are labeled as timing cells. As a result, cells I1 and I2 are also labeled as timing cells since they are along the traversal path to a timing cell. Traversal through I3 ends at cell R4. R4 is not reachable from either a primary input or a primary output, only through its clock pin. Cell R4 is not a timing cell so I3 is not labeled as a timing cell. It is, however, labeled as a clock load because its source, Ii, is a timing cell. The same argument applies to cell I4 with respect to R4. I4 is labeled as a clock load. Traversal through I5 and I11 does not end at a timing cell so they are not labeled as timing cells. Cell I5 would ordinarily be labeled as a clock load, however, it was already labeled as a timing cell during the traversal from input CG. Thus, I5 stays as a timing cell.

Labeling Summary:

| | |
|---|---|
| IN0 | Primary data input |
| IN1 | Primary data input |
| IN2 | Primary data input |
| CG | Primary data input |
| CLK | Primary clock input |
| I1 | Timing |
| I2 | Timing |
| I3 | Clock load |
| I4 | Clock load |
| I5 | Timing |
| I6 | Timing |
| I7 | Multi-driver load |
| I8 | Unlabeled |
| I9 | Unlabeled |
| I10 | Unlabeled |
| I11 | Timing |
| I12 | Timing |
| I13 | Unlabeled |
| I14 | Sink load |
| C1 | Timing |
| C2 | Timing |
| C3 | Timing |
| C4 | Timing |
| C5 | Timing |
| R1 | Timing |
| R2 | Timing |
| R3 | Timing |
| R4 | Unlabeled |
| R5 | Unlabeled |
| OUT0 | Primary data output |
| OUT1 | Primary data output |

After the labeling process is complete, it is possible to determine the complete set of cells that must remain in the logical timing shell. If a cell is not labeled in the timing graph, it will have no direct effect on the interface timing of the block and it may be safely neglected. These cells are deleted from the netlist and are represented by an empty hierarchical block called the "group" cell. Pins are created on the group cell for every net that crosses its boundary.

False Paths and Constant Propagation

An additional reduction in the number of cells labeled as timing cells is achieved through the application of false path constraints and constant propagation. If the timing of a portion of the circuit has infinite slack that portion of the circuit is not visible from the primary pins. As a result, those pins that have infinite slack can be treated as leaves in the graph when performing the input and output labeling above.

This has the benefit of giving the end-user control over what gets marked as a timing cell through the use of false path constraints and the application of constants.

Path Exceptions

Path exceptions that affect the timing at the primary pins are applied to the shell model in the same way as the original exceptions were applied to the full model. This is possible because path exceptions are applied to nodes in the timing graph, and all nodes visible from the primary pins are retained in the shell model. There is no need to attempt to rewrite the exceptions in terms of some reduced timing graph. Furthermore, path exceptions that are needed at the next higher level in the hierarchy are exposed (made visible) during the shell creation process. This is done by first identifying the constraints that need to be exposed and then rewriting them in a way that they can be applied when the shell model is instantiated at the next level. In this way path exceptions which cross hierarchical boundaries can be maintained in a consistent and accurate way throughout the design process.

Latch-based Designs

In one embodiment of the invention, latch-based designs produce an identical shell model to flip-flop-based designs in terms of how cells get labeled. In addition, to reflect the time-borrowing nature of latches, information that describes the amount of borrowing is saved for each latch in the shell model. This freezes the borrowing that is permitted for latches in the shell model while still allowing the next higher level of hierarchy to take advantage time borrowing.

In an alternate embodiment of the invention, latches can be treated in the same way as combinational logic cells. Only flip-flops would be treated as leaves in the depth-first traversals, thus eliminating the need to freeze the amount of timing borrowing that is permitted. However, in a purely latch based design this will result in an abstraction that provides no data reduction.

In a third possible embodiment of the invention, a compromise can be made, allowing a user-specified number of levels of latches to be treated as combinational cells before terminating the depth-first traversals. This will permit the user to control the flexibility of time borrowing against the size of the abstraction memory image.

Creation of the Physical Shell

Creation of the logical shell results in the set of cells that is required to represent the static timing paths that cross through the block's pins. The logical shell will also include all of the nets that connect to the pins of the retained cells.

The physical shell consists of the set of layout data (interconnect wires and vias) which is required to account for the physical effects of integrated circuit layout and fabrication: resistance, capacitance, inductance, routing congestion and process technology effects such as width and spacing rules, antenna rules and electromigration rules.

The amount of physical detail that must be retained in the physical abstraction depends on the level of accuracy required by the user. There is a direct trade-off between the level of accuracy and the quantity of data that must be retained.

Figure 12:
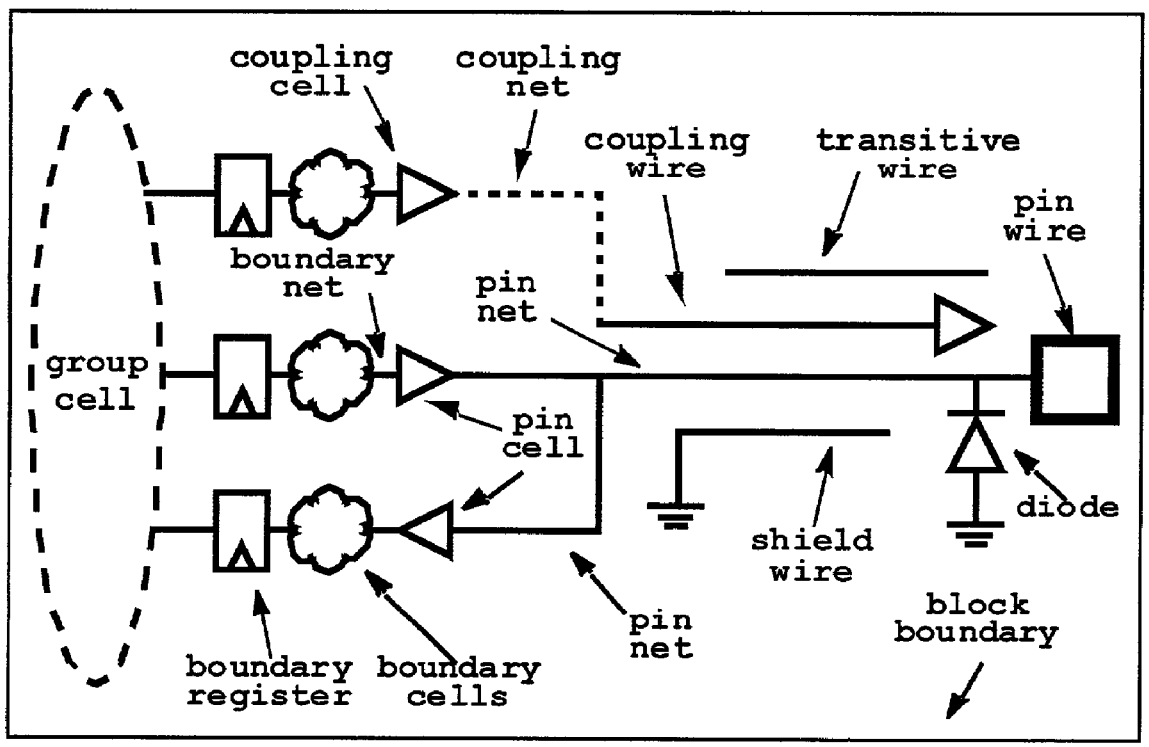
FIG. 12 shows the physical timing shell model in an embodiment of the invention.

The layout data is partitioned into several categories defined by the physical effects that they are used to model: 1) placement and routing, 2) antenna effects, 3) timing analysis (RC delay and capacitive coupling), 4) noise injection effects, and 5) IR-drop, and 6) electromigration effects. Several terms new to the art are introduced to describe these categories, which are illustrated in FIG. 12 and discussed in the following sections.

1) Placement and Routing

In order to make use of an abstracted block during placement and routing, it is sufficient to model the block with a) the physical dimensions of its boundary, b) the physical locations at which the router is permitted to connect to the block's pins, and c) the layers that the router may use to make these connections. The model shown in FIG. 12 requires the block-boundary and the set of all "pin-wires", defined as the wires that belong to the block's pins.

If over-block routing is to be allowed, then one must include enough information in the abstraction to indicate where the over-block routing is permitted and on which layers. These areas are modeled as a set of polygons that represent the areas which remain blocked to routing on each routing layer, and the inverse of this set of polygons is therefore the areas in which external routing is permitted. The set of blockages may be made as large as necessary to achieve any desired level of resolution. However, it is normally sufficient to restrict the non-blocked areas to a relatively small set of routing channels of fixed width which extends unbroken from one edge of the block to its opposite edge.

2) Antenna Rule Checking and Correction

One of the more difficult types of process technology rules to model accurately are the antenna rules. These rules model the damage that may be caused to MOSFET transistor gates by the charge accumulated on their connected metallic (aluminum or copper) routing wires. Charge accumulates on metal wires while they are being patterned and etched during manufacturing, possibly causing the thin gate oxide of it's the attached MOSFET gates to break down, but it is safely discharged by the junction diode formed at the attached MOSFET source/drain regions. The charge may also be discharged safely by dedicated diodes inserted specifically for this purpose.

In order to model these antenna effects accurately it is necessary to include in the abstraction all of the wires that are electrically connected to each pin, and all diodes, transistor gates, and transistor source/drains that are connected to the pins through those wires. In FIG. 12, these classes of items are labeled pin-wires, pin-nets, pin-cells, and diodes, respectively. With these physical objects included in the abstraction it is possible to perform antenna rule checks and also antenna rule violation repair in the context of the block's ancestors in the hierarchy.

3) Static Timing Analysis with Interconnect RC Delay

In order to perform an accurate static timing analysis of the block, the cells of the logical shell are needed, as well as the nets that interconnect them. FIG. 12 shows the group-cell and the set of boundary registers and other boundary cells that make up the logical-shell.

However, in addition to the idealized delay that can be computed with the logical-shell netlist, the parasitic effects caused by the block's layout geometries are also modeled. In order to correctly extract the resistance and capacitance seen by each of the cells in the timing shell it is necessary to include the wires attached to the block's primary input/output pins, called pin-wires in FIG. 12, as well the wires implementing all of the nets attached the cells in the timing shell, called shell-wires in FIG. 12.

The inclusion of the pin-wires and shell-wires includes all of the parasitic resistance and capacitance caused by the timing shell wires, but it neglects the sidewall capacitance contributed by their adjacent wires, called coupling-wires in FIG. 12. These wires must also be included in order to perform an accurate extraction and timing analysis of the block. However, note that when modeling simple RC-delay (without crosstalk), only the coupling-wires need to be included, not the set of all wires on the coupling-nets. These coupling-wires can be considered to be at a constant potential and therefore only serve to increase the effective capacitance of the pin-wires and shell-wires.

4) Static Timing Analysis with Crosstalk Delay and Noise Injection

Because of the well-known Miller effect, a voltage change on a wire will cause a corresponding change on all neighboring wires to which it is capacitively coupled. Thus, to accurately model the timing on the pin-wires and shell-wires in FIG. 12 one needs to know the actual signal waveforms on the coupling-wires. In order to calculate the coupling-wire waveforms it is required that the physical shell include all of the wires in the complete coupling net, and the logical-shell must include the cell(s) being driven by the coupling-net, plus the complete path from the coupling-net's driving cell(s) back to their source registers.

In addition, in order to correctly capture the capacitance seen by the coupling-net, one must include all wires that capacitively couple to the coupling-net. Since these are, in a sense, transitively coupled to the pin-wires and shell-wires, these are referred to as transitive-wires. Any coupling-nets that are at a constant potential, such as power and ground nets, will serve to shield the pin-nets and shell-nets from any crosstalk delay or noise injection. These are referred to as shield-wires, and no transitive-wires will be associated with them.

The degree of data reduction achievable through the logical and physical abstraction technique discussed above depends on the logical structure of the block design. Blocks that are largely register-bounded, with most of their netlists internal to the group-cell, will achieve a high degree of reduction. On the opposite extreme, blocks that are purely combinational will achieve no reduction whatsoever.

When a high degree of compression is necessary (for database size or runtime constraints, for example), the hierarchical partitioning process should be aware of the abstraction methodology and attempt to make the blocks as register bounded as possible. However, it is likely that even in an otherwise well-partitioned design, some nets will expose logic relatively deeply inside the block abstraction. Several techniques may be used to reduce the modeling requirements for these anomalous nets.

If the net in question is intentionally shielded, no crosstalk effects or noise injection will occur. The loading seen by each pin-wire and shell wire will be constant. Therefore the delay at each input pin will only depend on the signal waveform presented to the pin, and the delay of each output pin will only depend on the load presented to the pin. If these pins do not have near-critical delays they can be safely modeled using traditional delay models such as lookup tables and piecewise linear delay functions.

Even when a net is not completely shielded, static timing analysis may be used to develop pessimistic delay models for non-critical pins. Thus, the added complexity of the invention's abstraction mechanism need only be used for those pins that could contribute to the critical timing paths in the design.

One may also take advantage of the fact that ordinary logic gates have relatively high electrical gain, and therefore input slew dependencies tend to decay away after two or three levels of logic. With this assumption the labeling of timing cells can be stopped after two or three levels of logic have been encountered, and a simpler lookup-table based modeling technique can be used to model the effects of the additional excluded cells.

5) Static Timing Analysis with IR-Drop Analysis

As discussed earlier in this document, IR-drop is an effect caused by high currents flowing through the power distribution network in a chip. The voltage seen at any point in the network is equal to the current flowing through that point multiplied by the parasitic resistance seen between that point at the power supply. However, this effect can be offset somewhat by the parasitic capacitance present in the network, which serves to store some charge that can be treated as an alternate distributed current source. One can also make use of dedicated decoupling capacitors to enhance this effect.

When using a block abstraction during bottom-up verification, assume that the block itself has been analyzed and its IR-drop violations are known. The abstraction can be used to model the block's contribution to the IR-drop experienced by the block's parent. The interface between the block and its parent consists of the power supply pins at which the block's power supply network is connected to its parents. An exact model for IR-drop would consist, for each pin, of a time-varying current source or sink, plus an equivalent circuit for the RC-network between the pin and the power and ground supplies.

The invention's abstraction method is to model the circuit's non-ideal electrical effects by the circuit's netlist and physical geometries themselves, as opposed to idealized mathematical models. Unfortunately, IR-drop analysis is not path-based and local like static timing analysis or crosstalk, but rather is modeling a global effect that involves the entire power/ground network and every cell in the block. For this reason a simple electrical model can be used. Each pin is modeled as an ideal current source or sink, representing the results of a worst case electrical analysis of the block. This analysis may be a static analysis or a dynamic simulation. Each pin is also associated with an equivalent circuit for the internal RC-network, which is modeled as an impedance matrix.

6) Electromigration Analysis

Electromigration is also an effect associated with currents flowing through the wires of a circuit and their non-deal resistances and capacitances. However, unlike IR-drop analysis which involves only the supply distribution network, to electromigration analysis must be performed on the supply network as well as ordinary signal wires (it is normally only a problem on long resistive wires with large high-current driver cells.)

To model electromigration on the supply network wires the wire's parasitic impedance is needed, as well as how much current will be flowing through each wire. Various models of electromigration may require the maximum or average case current, or even a detailed time-domain simulation. For the supply network, this information is identical to that needed for IR-drop analysis, so the same abstraction mechanism described above can be used. For signal wires the information is identical to that required for the static timing analysis model. Therefore, no additional modeling information need be added to the abstraction to model electromigration effects.

An "Inverse" Abstraction Mechanism

In yet other embodiments of the invention, it is also possible to construct a form of "inverse" abstraction for use in a top-down verification flow, using essentially the same techniques. A process of bottom-up block verification in which the blocks are first analyzed and verified in isolation, and then verified again in the context of their parent blocks and siblings has been described above. Only the cells within the "group-cell", the cell's that are not included in the abstraction, can be verified in isolation. All timing paths and electrical effects that involve the cells and physical geometries included in the abstraction's logical shell require information about the block's parents and sibling blocks before they can be analyzed.

One may wish to analyze and verify a block on its own, perhaps as a certification processes necessary to release the block as a piece of standalone IP (Intellectual Property) meant for later re-use. In this scenario the block may be verified by instantiating it in a "test harness", which is an abstracted parent block representing some form of "reference platform", or typical implementation.

The abstraction process can be used to build a reduced model of this test harness. This technique permits a faster verification process than would be possible if the block were verified by embedding it in a complete reference chip design. Conversely, the abstraction model will be more accurate than a typical test harness, which may consist of nothing more than a simple set of timing constraints and typical pin loads and signal waveforms.

Such an "inverse" abstraction will look like a shell of logic and its associated physical geometries that lies outside the boundary of the block. It can be built using the same abstraction algorithm, except that it is executed on the parent block, and the pin traversal begins at the sub-block's interface pins rather than the parent block's primary input, output, and supply pins.

Figure 13:
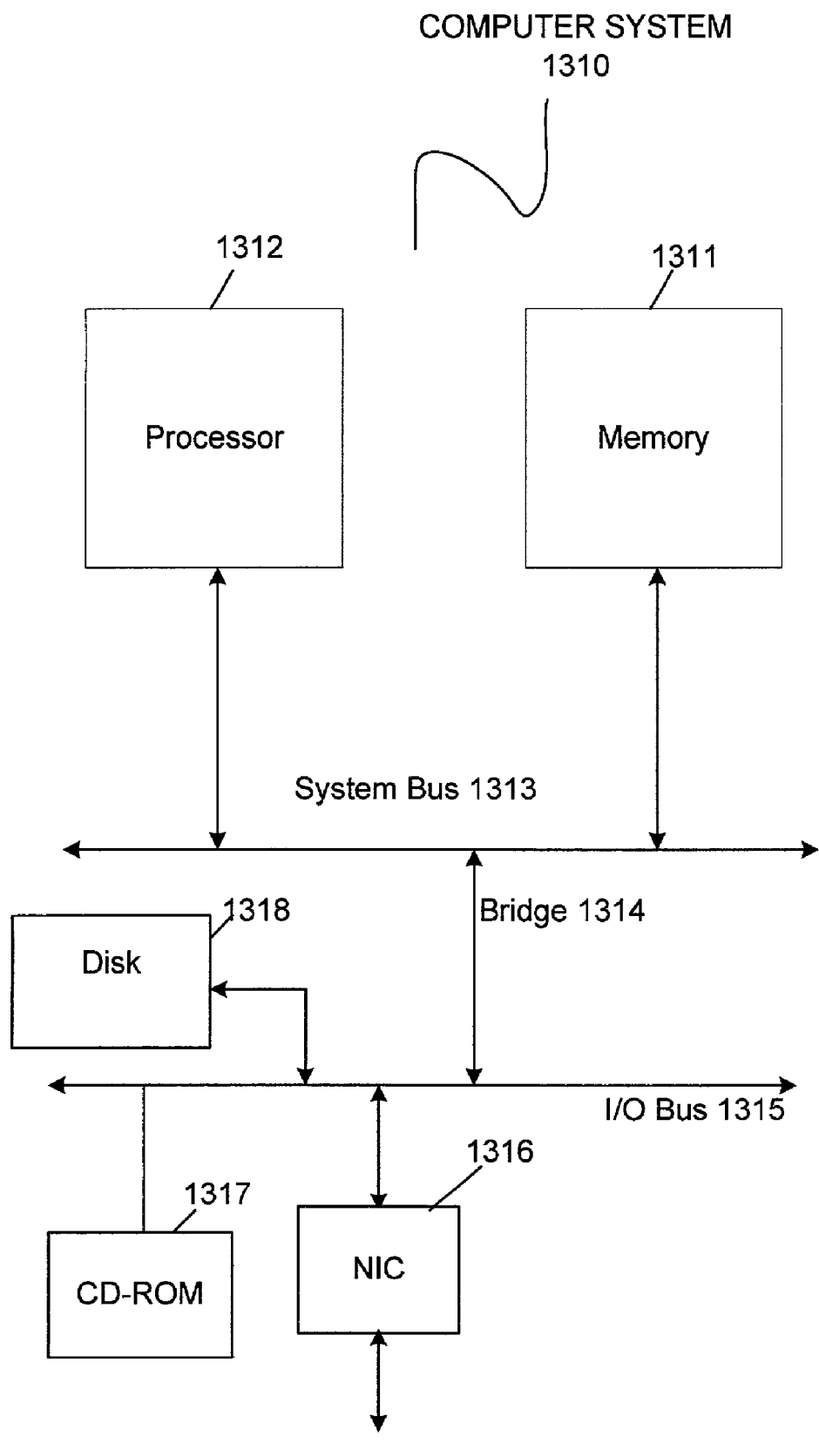
FIG. 13 illustrates an exemplary computer system capable of implementing and applying one or more embodiments of the invention.

FIG. 13 illustrates a computer system capable of implementing one or more embodiments of the invention. Illustrated is a computer system 1310, which may be any general or special purpose computing or data processing machine such as a PC (personal computer) which can optionally be coupled to a network 1300. The memory 1311 of computer system 1310 may be insufficient to hold the entire contents of a circuit design or its inputs and thus, the design process may need to be broken up hierarchically. In this way, pieces of the overall design can be handled by several different computer systems each of which may be similar to computer system 1310. In doing so, the abstraction model which extracts the design of block and sub-blocks (modules and sub-modules) must allow for a uniform and consistent application of the processes such as timing analysis, placement and routing and budgeting. The invention, as defined above, attempts to address the abstraction problem in hierarchical design.

One of ordinary skill in the art may program computer system G10 to perform the task of abstraction and sub-module design as set forth in various embodiments of the invention. Such program code may be executed using a processor 1312 such as CPU (Central Processing Unit) and a memory 1311, such as RAM (Random Access Memory), which is used to store/load instructions, addresses and result data as needed. The application(s) used to perform the functions of abstraction and sub-module design may derive from an executable compiled from source code written in a language such as C++. The executable may be loaded into memory 1311 and its instructions executed by processor 1312. The instructions of that executable file, which correspond with instructions necessary to perform abstraction, may be stored to a disk 1318, such as a floppy drive, hard drive or optical drive 1317, or memory G11. The various inputs such as the netlist(s), constraints, process characteristics, cell library and other such information may be written to/accessed from disk 1318, optical drive 1317 or even via network 1300 in the form of databases and/or flat files.

Computer system 1310 has a system bus 1313 which facilitates information transfer to/from the processor 1312 and memory 1311 and a bridge G14 which couples to an I/O bus 1315. I/O bus 1315 connects various I/O devices such as a network interface card (NIC) 1316, disk 1318 and optical drive 1317 to the system memory 1311 and processor 1312. Many such combinations of I/O devices, buses and bridges can be utilized with the invention and the combination shown is merely illustrative of one such possible combination.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

The invention claimed is:

1. A method used in producing a design of an integrated circuit said circuit design having cells and interconnects, said circuit having a representation that is hierarchically decomposed into a top-level and a plurality of blocks, at least some of the plurality of said blocks being capable of being further hierarchically decomposed and of having a parent block associated therewith, said method comprising:

processing at least one of said blocks such that an abstraction is created that includes physical interconnect information relating to interconnects between components within said at least one block, said physical interconnect information modeling parasitic electrical and physical effects of interconnects upon an estimated behavior of said integrated circuit, wherein said processing includes:

retaining only a sub-set of all of said physical interconnect information which influences physical and electrical behavior of said parent block; and retaining only a sub-set of cells which influences a logical behavior of said parent block; and utilizing said abstraction in another development phase performed on said parent block.

2. The method according to claim 1 wherein said utilizing includes:

replacing a description of said at least one block with a description of said abstraction.

3. The method according to claim 1, wherein retaining the sub-set of said physical interconnect information and of said cells includes:

determining contents of said at least one block's netlist.

4. The method according to claim 3, wherein said contents of said at least one block's netlist are determined by:

processing data inputs;
processing clock inputs.

5. The method according to claim 4 wherein processing data inputs comprises:

building a list of primary inputs.

6. The method according to claim 5 wherein until said list is empty, for each pin encountered, said processing data inputs further comprises:

removing said encountered pin from said list;
if said removed pin is a clock pin, then skipping said removed pin and continuing to the next pin; and
if said removed pin is not a clock pin, then processing forward said removed pin.

7. The method according to claim 6 wherein processing forward said removed pin comprises:

building a list of successors.

8. The method according to claim 7 wherein until said list of successors is empty, for each pin encountered, said processing forward said removed pin further comprises:

removing an encountered successor pin from said list of successors;
labeling said removed successor pin's cell as a timing cell;
if said removed successor pin is a clock pin, skipping said removed successor pin; and
if said removed successor pin is not a clock pin, then checking if said removed successor pin is a cell input.

9. The method according to claim 8 wherein if said removed successor pin is a cell input, said processing forward said removed pin further comprises:

checking to see if said removed successor pin has more than one predecessor cell;
if said removed successor pin has more than one predecessor cell, then labeling said more than one predecessor cell as multi-driver load cells, and recursively performing said processing forward said removed pin.

10. The method according to claim 9, wherein:

if said removed successor pin is not a cell input; or if said removed successor pin does not have more than one predecessor cell, then recursively performing said processing forward said removed pin.

11. The meted according to claim 4 wherein processing outputs comprises:

building a list of primary outputs.

12. The method according to claim 11 wherein until said list is empty, for each pin encountered, said processing outputs further comprises:

removing said encountered pin from said list;
processing backward said removed pin.

13. The method according to claim 12 wherein processing backward said removed pin comprises:

building a list of predecessors.

14. The method according to claim 13 wherein until said list of predecessors is empty, for each pin encountered, said processing backward said removed pin further comprises:

removing an encountered predecessor pin from said list of predecessors;
labeling said removed predecessor pin's cell as a timing cell;
if said removed predecessor pin is a clock pin, skipping said removed predecessor pin; and
if said removed predecessor pin is not a clock pin, then checking if said removed predecessor pin is a cell output.

15. The method according to claim 14 wherein if said removed predecessor pin is a cell output, said processing backward said removed pin further comprises:

labeling successor cells as sink load cells; and
recursively performing said processing backward said removed pin.

16. The method according to claim 14 wherein:

if said removed successor pin is not a cell output then recursively performing said processing backward said removed pin.

17. The method according to claim 4 wherein processing clock inputs comprises:

building a list of primary clock inputs.

18. The method according to claim 17 wherein until said list is empty, for each pin encountered, said processing clock inputs further comprises:

removing said encountered pin from said list;
processing forward said removed pin.

19. The method according to claim 18 wherein processing forward said removed pin comprises:

building a list of successors.

20. The method according to claim 19 wherein until said list of successors is empty, for each pin encountered, said processing forward said removed pin further comprises:

removing an encountered successor pin from said list of successors;
if said removed successor pin is a clock pin, recursively processing forward said removed successor pin; and
if said removed successor pin is not a clock pin, then skipping said removed successor pin.

21. The method according to claim 20 wherein after recursively processing forward said removed successor pin, said processing said clock outputs further comprises:

checking if any successor cells are labeled as timing cells.

22. The method according to claim 21 wherein if any successor cells are labeled as dining cells, said processing said clock outputs further comprises:

labeling said removed successor pin's cells as timing cells; and
labeling said successor cells as clock load cells.

23. The method according to claim 21 wherein if no successor cells are labeled as timing cells, ten skipping said removed successor pin.

24. The method according to claim 1 wherein said physical interconnect information models physical and electrical effects of a circuit layout and fabrication process.

25. The method according to claim 24 wherein said physical and elecrical effects include at least one of placement and routing constraints, antenna effects, static timing analysis with RC delay modeling, static timing analysis wit capacitive coupling and noise injection, static timing analysis with IR-drop modeling, and electromigration analysis.

26. The method according to claim 25 wherein placement and routing effects of said at least one block are modeled using one or more of physical dimensions of said at least one block's boundaries, physical locations where permitted connections are made to said at least one block's pins, and layers used to make said permitted connections.

27. The method according to claim 25 wherein antenna effects are modeled by including in said abstraction all of pin-wires that are electrically connected to each pin, and all diodes, transistor gates, and transistor sources/drains that are connected to pins through those pin-wires.

28. The method according to claim 25 wherein resistance-capacitance (RC) interconnect delay during static timing analysis is modeled by including in said abstraction pin-wires attached to the block's primary input/output pins, and wires implementing all pin-nets attached to the cells in a timing shell.

29. The method according to claim 28 wherein sidewall coupling during static timing analysis is modeled by including in said abstraction coupling-wires that may be capacitively coupled to the pin-wires.

30. The method according to claim 29 wherein electromigration effects are modeled, for signal nets using the same information required for static timing analysis.

31. The method according to claim 28 wherein noise injection and delay changes during static timing analysis due to capacitive coupling are modeled by including in said abstraction at least one of:
a) all of the wires on coupling-nets that may be capacitively coupled to pin-wires,
b) coupling-cells that drive these coupling-nets and coupling-cells that are driven by these coupling-nets, with input pins of driving cells being modeled with arrival times and slew values derived during simulation of the block, and
c) transitive-wires that may be coupled to said included coupling-nets.

32. The method according to claim 28 wherein noise injection and delay changes during static timing analysis due to capacitive coupling are modeled by including in said abstraction at least one of:
a) all of the wires on coupling-nets that may be capacitively coupled to the pin-wires
b) coupling-cells that drive these coupling-nets and coupling-cells that are driven by these coupling-nets, with input pins of driving cells being modeled by including an entire cone of combinational logic, up to and including a first latch or flip-flop, that drives these coupling-nets, as well as all of the wires on the coupling-nets that are attached to the pins on additional cells, and
c) transitive-wires that may be coupled to said included coupling-nets.

33. The method according to claim 25 wherein IR drop effects are modeled using a simplified electrical model of a block wherein each pin is modeled as an ideal current sink/source and an associated impedance matrix to model its internal RC-network.

34. The method according to claim 33 wherein electromigration effects are modeled, for power nets, using the same information required for power drop effects.

35. An article comprising a computer-readable medium having instructions stored thereon implementing a method used in producing a design of an integrated circuit design, said circuit design having cells and interconnects, said circuit having a representation that is hierarchically decomposed into a top-level and a plurality of blocks, at least some of the plurality of said blocks being capable of being further hierarchically decomposed and of having a parent block associated therewith, said instructions which when executed causes:
processing at least one of said blocks such tat an abstraction is created that includes physical interconnect information relating to interconnects between components within said at least one block, said physical interconnect information modeling parasitic electrical and physical effects of interconnects upon an estimated behavior of said integrated circuit, wherein said processing includes:
retaining only a sub-set of all of said physical interconnect information which influences physical and electrical behavior of said parent block; and
retaining only a sub-set of cells which influences a logical behavior of said parent block; and
utilizing said abstraction in another development phase performed on said parent block.

36. The article according to claim 35 wherein utilizing includes:
replacing a description of said at least one block with a description of said abstraction.

37. The article according to claim 35, wherein retaining the sub-set of said physical interconnect information and of said cells includes:
determining contents of said at least one block's netlist.

38. The article according to claim 37, wherein said contents of the logical shell are determined by:
processing data inputs;
processing outputs; and
processing clock inputs.

39. The article according to claim 38 wherein processing data inputs comprises:
building a list of primary inputs.

40. The article according to claim 39 wherein until said list is empty, for each pin encountered, said processing data inputs further comprises:
removing an encountered pin from said list;
if said removed pin is a clock pin, then skipping said removed pin and continuing to the next pin; and
if said removed pin is not a clock pin, then processing forward said removed pin.

41. The article according to claim 40 wherein processing forward said removed pin comprises:
building a list of successors.

42. The article according to claim 41 wherein until said list of successors is empty, for each pin encountered, said processing forward said removed pin further comprise:
removing an encountered successor pin from said list of successors;
labeling said removed successor pin's cell as a timing cell;
if said removed successor pin is a clock pin, skipping said removed successor pin; and if said removed successor pin is not a clock pin, then checking if said removed successor pin is a cell input.

43. The article according to claim 42 wherein if said removed successor pin is a cell input, said processing forward said removed pin further comprises:
   checking to see if said removed successor pin has more than one predecessor cell;
   if said removed successor pin has more than one predecessor cell, then labeling said more than one predecessor cell as multi-driver load cells, and recursively performing said processing forward said removed pin.

44. The article according to claim 43 wherein:
   if said removed successor pin is not a cell input; or
   if said removed successor pin does not have more than one predecessor cell, then recursively performing said processing forward said removed pin.

45. The article according to claim 38 wherein processing outputs comprises:
   building a list of primary outputs.

46. The article according to claim 45 wherein until said list is empty, for each pin encountered, said processing outputs further comprises:
   removing said encountered pin from said list;
   processing backward said removed pin.

47. The article according to claim 46 wherein processing backward said removed pin comprises:
   building a list of predecessors.

48. The article according to claim 47 wherein until said list of predecessors is empty, for each pin encountered, said processing backward said removed pin further comprises:
   removing an encountered predecessor pin from said list of predecessors;
   labeling said removed predecessor pin's cell as a timing cell;
   if said removed predecessor pin is a clock pin, skipping said removed predecessor pin; and
   if said removed predecessor pin is not a clock pin, then checking if said removed predecessor pin is a cell output.

49. The article according to claim 48 wherein if said removed predecessor pin is a cell output, said processing backward said removed pin further comprises:
   labeling successor cells as sink load cells; and
   recursively performing said processing backward said removed pin.

50. The article according to claim 48 wherein:
   if said removed successor pin is not a cell output then recursively performing said processing backward said removed pin.

51. The article according to claim 38 wherein processing clock inputs comprises:
   building a list of primary clock inputs.

52. The article according to claim 51 wherein until said list is empty, for each pin encountered, said processing clock inputs further comprises:
   removing said encountered pin from said list;
   processing forward said removed pin.

53. The article according to claim 52 wherein processing forward said removed pin comprises:
   building a list of successors.

54. The article according to claim 53 wherein until said list of successors is empty, for each pin encountered, said processing forward said removed pin further comprises:
   removing an encountered successor pin from said list of successors;
   if said removed successor pin is a clock pin, recursively processing forward said removed successor pin; and
   if said removed successor pin is not a clock pin, ten skipping said removed successor pin.

55. The article according to claim 54 wherein after recursively processing forward said removed successor pin, said processing said clock outputs further comprises:
   checking if any successor cells are labeled as timing cells.

56. The article according to claim 55 wherein if any successor cells are labeled as timing cells, said processing said clock outputs further comprises:
   labeling said removed successor pin's cells as timing cells; and
   labeling said successor cells as clock load cells.

57. The article according to claim 55 wherein if no successor cells are labeled as timing cells, then skipping said removed successor pin.

58. The article according to claim 35 wherein said physical interconnect information includes physical effects of a circuit layout and fabrication process.

59. The article according to claim 58 wherein said physical effects include at least one of placement and routing constraints, antenna effects, static timing analysis with RC delay modeling, static timing analysis with capacitive coupling and noise injection, static timing analysis with IR-drop modeling, and electromigration analysis.

60. The article according to claim 59 wherein placement and routing effects of said at least block are modeled using one or more of physical dimensions of said at least one block's boundaries, physical locations where permitted connections are made to said block's pins, and layers used to make said permitted connections.

61. The article according to claim 59 wherein antenna effects are modeled by including in said abstraction all of pin-wires that are electrically connected to each pin, and all diodes, transistor gates, and transistor sources/drains that are connected to pins through those pin-wires.

62. The article according to claim 59 wherein resistance-capacitance (RC) interconnect delay during static timing analysis is modeled by including in said abstraction pin-wires attached to the block's primary input/output pins, and wires implementing all pin-nets attached to the cells in a timing shell.

63. The article according to claim 62 wherein sidewall coupling analysis during static timing analysis is modeled by including in said abstraction coupling-wires that may be capacitively coupled to the pin-wires.

64. The article according to claim 63 wherein electromigration effects are modeled, for signal nets using the same information required for static timing analysis.

65. The article according to claim 62 wherein noise injection and delay changes during static timing analysis due to capacitive coupling are modeled by including in said abstraction at least one of:
   a) all of wires on the coupling-nets that may be capacitively coupled to the pin-wires,
   b) coupling-cells that drive these coupling-nets and coupling-cells that are driven by these coupling-nets, with input pins of driving cells being modeled with arrival times and slew values derived during simulation of the block, and
   c) transitive-wires that may be coupled to said included coupling-nets.

66. The article according to claim 62 wherein noise injection and delay changes during static timing analysis due to capacitive coupling are modeled by including in said abstraction at least one of:
   a) all of the wires on coupling-nets that may be capacitively coupled to the pin-wires,
   b) coupling-cells that drive these coupling-nets and coupling-cells that are driven by these coupling-nets, with input pins of driving cells being modeled by including an entire cone of combinational logic, up to and including a first latch or flip-flop, that drives these coupling-nets, as well as all of the wires on the coupling-nets that are attached to the pins on additional cells, and
   c) the transitive-wires that may be coupled to said included coupling-nets.

67. The article according to claim 59 wherein IR drop effects are modeled using a simplified electrical model of a block wherein each pin is modeled as an ideal current sink/source and an associated impedance matrix to model its internal RC-network.

68. The article according to claim 67 wherein electromigration effects are modeled, for power nets, using the same information required for power drop effects.

* * * * *